US009775239B2

(12) United States Patent
Arisawa et al.

(10) Patent No.: US 9,775,239 B2
(45) Date of Patent: Sep. 26, 2017

(54) RESIN COMPOSITION FOR PRINTED WIRING BOARD, PREPREG, METAL-CLAD LAMINATE, AND PRINTED WIRING BOARD

(71) Applicant: Panasonic Intellectual Property Management Co., Ltd., Osaka (JP)

(72) Inventors: Tatsuya Arisawa, Fukushima (JP); Yoshihiko Nakamura, Fukushima (JP); Tomoyuki Abe, Fukushima (JP); Kiyotaka Komori, Mie (JP); Syouji Hasimoto, Fukushima (JP); Mitsuyoshi Nishino, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/128,093

(22) PCT Filed: Apr. 7, 2015

(86) PCT No.: PCT/JP2015/001941
§ 371 (c)(1),
(2) Date: Sep. 21, 2016

(87) PCT Pub. No.: WO2015/155982
PCT Pub. Date: Oct. 15, 2015

(65) Prior Publication Data
US 2017/0099731 A1  Apr. 6, 2017

(30) Foreign Application Priority Data

| Apr. 8, 2014 | (JP) | 2014-079566 |
| Sep. 30, 2014 | (JP) | 2014-201427 |
| Feb. 13, 2015 | (JP) | 2015-026301 |

(51) Int. Cl.
H05K 1/00 (2006.01)
H05K 1/03 (2006.01)
(Continued)

(52) U.S. Cl.
CPC ........... *H05K 1/0373* (2013.01); *B32B 15/08* (2013.01); *B32B 27/20* (2013.01); *C08J 5/10* (2013.01);
(Continued)

(58) Field of Classification Search
CPC . H05H 1/03; H05H 1/373; H05K 3/67; B32B 15/08
(Continued)

(56) References Cited

U.S. PATENT DOCUMENTS 4,545,926 A * 10/1985 Fouts, Jr. ................ H01B 1/20
                                                              252/502
4,590,115 A *  5/1986 Cassat ..................... C25D 5/56
                                                              205/158

(Continued)

FOREIGN PATENT DOCUMENTS

JP  2011-074124  4/2011
JP  2012-023248  2/2012
(Continued)

OTHER PUBLICATIONS

International Search Report of PCT application No. PCT/JP2015/001941 dated Jul. 7, 2015.

*Primary Examiner* — Xiaoliang Chen
(74) *Attorney, Agent, or Firm* — Greenblum & Bernstein, P.L.C.

(57) ABSTRACT

A resin composition for printed circuit board contains a resin component containing a thermosetting resin, and an inorganic filler. The inorganic filler contains crushed silica having a specific surface area in a range from 0.1 m²/g to 15

(Continued)

$m^2/g$, inclusive, and molybdenum compound particles each having a molybdenum compound in at least a surface layer portion. A content of the crushed silica is in a range from 10 parts by mass to 150 parts by mass inclusive with respect to 100 parts by mass of the resin component.

13 Claims, 1 Drawing Sheet

(51) Int. Cl.
  *B32B 15/08* (2006.01)
  *B32B 27/20* (2006.01)
  *C08J 5/24* (2006.01)
  *H05K 3/00* (2006.01)
  *C08J 5/10* (2006.01)

(52) U.S. Cl.
  CPC .............. *C08J 5/24* (2013.01); *H05K 3/0067* (2013.01); *B32B 2305/076* (2013.01); *B32B 2457/08* (2013.01); *C08J 2300/24* (2013.01); *C08J 2363/00* (2013.01); *C08J 2371/12* (2013.01)

(58) Field of Classification Search
  USPC ........... 174/258; 428/174, 418, 913; 442/59, 442/234, 239; 600/459
  See application file for complete search history.

(56) References Cited

U.S. PATENT DOCUMENTS

| | | | |
|---|---|---|---|
| 6,335,307 B1* | 1/2002 | Imai | B41M 5/42 428/32.68 |
| 6,423,331 B1* | 7/2002 | Mangold | A61K 8/25 423/335 |
| 8,231,970 B2* | 7/2012 | Walters | C08F 283/006 252/387 |
| 2006/0216495 A1 | 9/2006 | Motobe et al. | |
| 2010/0233487 A1* | 9/2010 | Millero | B82Y 30/00 428/418 |
| 2012/0276392 A1* | 11/2012 | Takahashi | B32B 15/08 428/418 |
| 2013/0096233 A1 | 4/2013 | Iwami et al. | |
| 2013/0172459 A1 | 7/2013 | Tsuchikawa et al. | |
| 2014/0151733 A1* | 6/2014 | Koike | G03F 7/0002 257/98 |
| 2014/0257109 A1* | 9/2014 | Nishikubo | H01L 41/37 600/459 |
| 2015/0050472 A1* | 2/2015 | Saito | C08L 71/00 428/206 |
| 2015/0376444 A1 | 12/2015 | Saito et al. | |
| 2016/0176762 A1* | 6/2016 | Jansen | C04B 35/0435 264/681 |
| 2016/0229990 A1* | 8/2016 | Du | C08J 5/24 |

FOREIGN PATENT DOCUMENTS

| | | |
|---|---|---|
| JP | 2014-152283 | 8/2014 |
| WO | 2005/007724 | 1/2005 |
| WO | 2011/118584 | 9/2011 |
| WO | 2012/018126 | 2/2012 |

* cited by examiner

RESIN COMPOSITION FOR PRINTED WIRING BOARD, PREPREG, METAL-CLAD LAMINATE, AND PRINTED WIRING BOARD

CROSS-REFERENCE TO RELATED APPLICATIONS

This application is a U.S. national stage application of the PCT International Application No. PCT/JP2015/001941 filed on Apr. 7, 2015, which claims the benefit of foreign priority of Japanese patent applications 2014-079566 filed on Apr. 8, 2014, 2014-201427 filed on Sep. 30, 2014 and 2015-026301 filed on Feb. 13, 2015, the contents all of which are incorporated herein by reference.

TECHNICAL FIELD

The present invention relates to a resin composition for printed circuit board, a prepreg, and a metal-clad laminate. They are used as printed circuit board materials. The present invention further relates to a printed circuit board produced using these materials.

BACKGROUND ART

Printed circuit boards are widely used in various kinds of fields, such as electronic devices, communication devices, and calculators. In particular, multi-functionalization, performance enhancement, thinning, and downsizing of small portable devices such as a portable communication device and a notebook computer have been rapidly advanced in recent years. Thus, electronic components such as semiconductor packages which are mounted in such devices have been made thinner and smaller. Accompanied by this situation, there is a need for wiring pattern refining, multilayering, thinning, and performance enhancement (e.g., enhancement of mechanical characteristics) of a printed circuit board which is used to mount these electronic components.

As a printed circuit board has been made thinner, there are concerns such as warpage of a printed circuit board resulting from a difference in coefficient of linear thermal expansion (hereinafter, CTE) between a conductor layer for forming a circuit and an insulating layer or a difference in CTE between a mounting component and an insulating layer. As a method for preventing the warpage, a reduction in CTE of the insulating layer is known to be effective. Accordingly, development of technologies for reducing the CTE of the insulating material constituting the insulating layer has been made. In the case of a multi-layered printed circuit board, electrical connection between layers is achieved by making via holes or the like in an insulating layer. In order to ensure reliability of this electrical connection between layers, it is required to decrease CTE in a board thickness direction.

In order to reduce the CTE of the insulating layer, there is known a method of adding an inorganic filler to a resin composition constituting an insulating layer. Silica is used as the inorganic filler.

For example, PTL 1 proposes an epoxy resin composition for prepregs. The epoxy resin composition essentially contains a predetermined phosphorus compound, a two functional epoxy resin, a polyfunctional epoxy resin, a curing agent, an inorganic filler, and a molybdenum compound. Examples of the inorganic filler include magnesium hydroxide, silica, and talc. A printed circuit board produced from this epoxy resin composition for prepregs is excellent in glass transition temperature (Tg), flame retardancy, heat resistance, and stiffness during heating and is also excellent in hole position accuracy.

Further, PTL 2 proposes a thermosetting resin composition containing a thermosetting resin, silica, and a molybdenum compound where a content of silica is in a range from 20% by volume to 60% by volume inclusive. A printed circuit board produced from this resin composition is excellent in drilling workability, and the insulating layer of the printed circuit board has excellent electrical insulation and low thermal expansibility.

Further, PTL 3 discloses a resin composition containing a reaction product obtained by previously reacting at least a part of hydroxyl groups on polyphenylene ether with epoxy groups on an epoxy compound, a cyanate ester compound, and an organometallic salt. This constitution allows producing a hardened substance that can maintain excellent dielectric characteristics of polyphenylene ether and has an excellent glass transition temperature (Tg).

CITATION LIST

Patent Literature

PTL 1: International Publication No. WO 2011/118584
PTL 2: Unexamined Japanese Patent Publication No. 2012-23248
PTL 3: Unexamined Japanese Patent Publication No. 2014-152283

SUMMARY OF THE INVENTION

The present invention provides a resin composition for printed circuit board that satisfies a demand for cost reduction, has a low coefficient of linear thermal expansion, excellent drilling workability, and moldability, as well as a prepreg, a metal-clad laminate and a printed circuit board using the resin composition.

A first resin composition for printed circuit board according to the present invention contains a resin component containing a thermosetting resin, and an inorganic filler. The inorganic filler contains crushed silica having a specific surface area in a range from 0.1 m$^2$/g to 15 m$^2$/g, inclusive, and molybdenum compound particles each having a molybdenum compound in at least a surface layer portion thereof. A content of the crushed silica is in a range from 10 parts by mass to 150 parts by mass, inclusive, with respect to 100 parts by mass of the resin component.

In the first resin composition for printed circuit board of the present invention, in spite of using crushed silica which is relatively inexpensive, the crushed silica has a predetermined specific surface area. The content of crushed silica is also limited to a specific range. The molybdenum compound particles are used together. This constitution allows for a reduction in coefficient of linear thermal expansion of the printed circuit board which is a final form of a hardened substance and also achieves excellent drilling workability.

A second resin composition for printed circuit board according to the present invention contains a resin component and an inorganic filler. The resin component contains (a) and (b) listed below, and the inorganic filler contains (c) and (d) listed below:

(a) a preliminary reaction product obtained by reacting polyphenylene ether with an epoxy compound having an epoxy group;
(b) a cyanate ester compound;
(c) surface-treated hydrophobic silica particles; and
(d) molybdenum compound particles each having a molybdenum compound in at least a surface layer portion.

From the second resin composition for printed circuit board of the present invention, it is possible to produce a hardened substance which is stably excellent in glass transition temperature and dielectric characteristics and has good drilling workability and moldability.

A prepreg according to the present invention is obtained by impregnating a base material with any one of the above-mentioned resin compositions for printed circuit board and semi-hardening the resin composition.

A metal-clad laminate according to the present invention is obtained by laminating a metal foil on the above-mentioned prepreg to produce a laminated body and heat press-molding the laminated body to form an integrated body.

A printed circuit board according to the present invention is obtained by removing a part of the metal foil of the metal-clad laminate to form a conductor pattern.

DESCRIPTION OF EMBODIMENTS (First Exemplary Embodiment)

Figure 1:
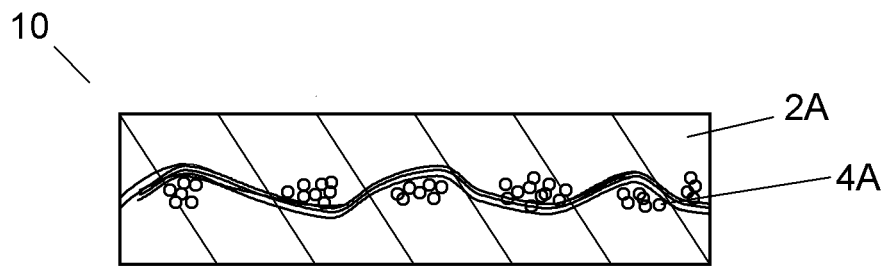
FIG. 1 is a schematic cross sectional view of a prepreg according to an exemplary embodiment of the present invention.

Prior to the explanation of a first exemplary embodiment of the present invention, problems in conventional constitutions will be described. In the resin composition for printed circuit board, silica is generally used as an inorganic filler which is added to reduce CTE. The use of silica results in giving good electric characteristics and heat resistance to a hardened substance. Known examples of silica include spherical silica and crushed silica.

On the other hand, in the case where an insulating layer contains a large amount of the inorganic filler, there is a problem of workability such that a drill blade is easily worn out during drilling of a printed circuit board when forming through holes. In the case of using spherical silica, the drilling workability is relatively good. PTL 2 describes that molten spherical silica is preferred. Thus, the fact that the shape of each silica particle is spherical is considered to contribute to improvement in drilling workability and moldability. As described in PTL 1 and PTL 2, it is also known that the addition of a molybdenum compound to a resin composition is effective in order to improve drilling workability.

It has been recently demanded in the market that cost of materials for printed wiring board is decreased while realizing low CTE in the insulating layer and maintaining a high level of various characteristics. Molten spherical silica is produced by, for example, subjecting ground silica powder to a processing such as melting in flame and spheroidizing. For this reason, molten spherical silica is more expensive than crushed silica. However, although the use of crushed silica as an alternative of spherical silica is economically advantageous, there is a possibility that drilling workability and moldability may be largely reduced.

In order to solve the above problems, the present inventors have attempted to use ground silica as an inorganic filler and further attempted to add a molybdenum compound.

However, in the case of a resin composition including crushed silica simply instead of spherical silica, it is not possible to sufficiently improve a reduction in drilling workability and moldability. Consequently, the present inventors have found that crushed silica having a specific surface area is used and a content of the crushed silica is limited to a specific range, whereby the above problems can be solved.

Hereinafter, the first exemplary embodiment of the present invention will be described. The resin composition for printed circuit board according to the first exemplary embodiment (hereinafter simply referred to as "resin composition") contains a resin component and an inorganic filler.

The resin component contains a thermosetting resin and further contains a curing agent and a curing accelerator, if necessary.

Examples of the thermosetting resin may include epoxy resins, phenol resins, imide resins, cyanate ester resins, isocyanate resins, modified polyphenylene ether resins, benzoxazine resins, and oxetane resins. In particular, examples of the epoxy resins may include bisphenol A type epoxy resins, bisphenol F type epoxy resins, phenol novolak type epoxy resins, cresol novolak type epoxy compounds, bisphenol A novolak type epoxy compounds, biphenyl aralkyl type epoxy resins, naphthalene ring-containing epoxy compounds, and dicyclopentadiene (DCPD) type epoxy resins Only one kind of these thermosetting resins may be used or two or more kinds thereof may be used in combination.

There is no particular limitation as to the curing agent so long as it can react with the thermosetting resin to form a cross-linked structure. Examples of the curing agent may include polyfunctional phenol compounds having two or more functional groups, polyfunctional amine compounds, acid anhydride compounds, vinyl group-containing compounds, low molecular weight polyphenylene ether compounds, dicyandiamide, and triallyl isocyanurate.

Examples of the curing accelerator may include imidazole compounds, amine compounds, thiol compounds, and organic acid salts of metal such as metal soap. Only one kind of these curing accelerators may be used or two or more kinds thereof may be used in combination.

If necessary, the resin component may further contain another resin compound such as a thermoplastic resin, a flame retardant, a colorant, a coupling agent or the like.

The inorganic filler contains molybdenum compound particles and crushed silica having a specific surface area in a range from 0.1 m$^2$/g to 15 m$^2$/g, inclusive. The specific surface area of the crushed silica is preferably in a range from 9 m$^2$/g to 15 m$^2$/g, inclusive.

The crushed silica is prepared by grinding fused silica, crystalline silica mined from mineral, or the like. Since the specific surface area of the crushed silica is 0.1 m$^2$/g or more, when a laminate such as a metal-clad laminate is produced using the resin composition, the drilling workability of the laminate is good. As described above, it is generally known that when crushed silica is used, drilling workability is significantly reduced, for example, a drill blade is easily worn out during making holes in the laminate or the like with the drill, compared to the case of using spherical silica. However, the combination use of the crushed silica having a specific surface area of 0.1 m$^2$/g or more and molybdenum compound particles results in significant improvement in wearing out of the drill blade. Conversely, in the case of using crushed silica having a specific surface area less than 0.1 m$^2$/g, even if molybdenum compound particles are used together, it is not possible to expect sufficient improvement in drilling workability. On the other hand, the use of the crushed silica having a specific surface area of 15 m²/g or less prevents the resin composition in the form of a varnish from thickening. Further, an increase in melt viscosity during heat-molding is inhibited, and resin flowability is within a suitable range. Thus, the moldability during the laminate production is good. This prevents difficulty in prepreg production and remaining of voids (cavities) in the insulating layer of the laminate. The specific surface area can be measured by a BET method.

A content of the crushed silica in the resin composition is in a range from 10 parts by mass to 150 parts by mass, inclusive, with respect to 100 parts by mass of the resin component, and is preferably in a range from 10 parts by mass to 100 parts by mass, inclusive. If the content of the crushed silica is less than 10 parts by mass, a degree in which the crushed silica contributes to low CTE is too low. Thus, it is necessary to add a large amount of another inorganic filler such as spherical silica in order to sufficiently reduce CTE. That is, there is substantially no meaning of containing the crushed silica. Conversely, if the content of the crushed silica is more than 150 parts by mass, it is necessary to use a large amount of molybdenum compound particles in order to sufficiently improve drilling workability. In this case, heat resistance may be reduced. On the other hand, suppression in amount of the molybdenum compound particles to be used may result in a possibility that it is difficult to sufficiently improve drilling workability.

There is no limitation as to the combination of the specific surface area and content of the crushed silica as long as the specific surface area and content of the crushed silica are in the above range. In particular, in the case where the specific surface area of the crushed silica is in a range from 9 m²/g to 15 m²/g, inclusive, the content of the crushed silica is preferably in a range from 10 parts by mass to 100 parts by mass, inclusive, with respect to 100 parts by mass of the resin component. As the specific surface area of the crushed silica is larger, the melt viscosity of the resin composition during molding tends to increase. Thus, a reduction in the content of the crushed silica ensures fluidity of the resin composition and makes moldability good.

The molybdenum compound particles are inorganic particles each having a molybdenum compound in at least a surface layer portion thereof. When the molybdenum compound particles are used in combination with the crushed silica, the molybdenum compound serves as a lubricant. Accordingly, the wearing out of the drill by the crushed silica is suppressed and drilling workability is improved. The whole of the molybdenum compound particles may be formed of the molybdenum compound, or the molybdenum compound particles may be particles each in which a surface of a carrier formed of an inorganic material other than the molybdenum compound supports or is covered with the molybdenum compound.

In the molybdenum compound particles, it is assumed that the molybdenum compound present in the surface layer portion mainly acts on suppression of wearing out of the drill. Thus, in order to obtain an improvement effect of drilling workability by a small amount of the molybdenum compound, likewise the latter case, it is preferable to use particles having the molybdenum compound on a surface of the support formed of another inorganic material. Generally, a specific gravity of the molybdenum compound is larger than that of an inorganic filler such as silica and has a large specific gravity difference from the resin component. Therefore, it is preferable to use particles having the molybdenum compound on the surface of the support formed of another inorganic material from the viewpoint of also dispersibility in the resin composition. As the inorganic material serving as the support, talc, aluminum hydroxide, boehmite, magnesium hydroxide, and silica, which are usually used as inorganic fillers for laminates, may be appropriately used. The support has an average particle diameter of preferably 0.05 μm or more. Such molybdenum compound particles are commercially available and examples thereof include KEMGARD manufactured by Sherwin-Williams Company.

Examples of the molybdenum compound constituting the molybdenum compound particles include molybdenum oxides, molybdic acid compounds, and other molybdenum compounds. Examples of the molybdenum oxides include molybdenum trioxides. Examples of the molybdic acid compounds include zinc molybdate, calcium molybdate, magnesium molybdate, ammonium molybdate, barium molybdate, sodium molybdate, potassium molybdate, phosphomolybdate, ammonium phosphomolybdate, sodium phosphomolybdate, and silicomolybdate. Examples of the other molybdenum compounds include molybdenum boride, molybdenum disilicide, molybdenum nitride, and molybdenum carbide. These compounds may be used singly, or in combination of two or more kinds thereof. Among the compounds, zinc molybdate ($ZnMoO_4$), calcium molybdate ($CaMoO_4$), and magnesium molybdate ($MgMoO_4$) are preferred from the viewpoint of chemical stability, moisture resistance, and insulation. Only one kind of these compounds may be used, two or more kinds thereof may be used in combination or all three kinds thereof may be used.

A content of the molybdenum compound particles is preferably in a range from 0.1% by volume to 10% by volume, inclusive, with respect to 100% by volume of the inorganic filler (total amount). When the content of the molybdenum compound particles is 0.1% by volume or more, the compound particles sufficiently function as a lubricant. Thus, the drilling workability of the laminate can be improved. When the content of the molybdenum compound particles is 10% by volume or less, it is possible to suppress influence on the heat resistance of the laminate or on peel strength of copper foil. Further, the molybdenum compound has low oil absorption, so that when the content of the molybdenum compound particles is in the above range, the resin flowability during molding or the like is not practically affected.

The molybdenum compound is contained in the molybdenum compound particles. A total content of the molybdenum compound in the resin composition is preferably in a range from 0.05 part by mass to 5 parts by mass, inclusive, with respect to 100 parts by mass of the resin component. If the content of the molybdenum compound in the resin composition is less than 0.05 part by mass, a sufficient improvement effect of drilling workability may not be obtained. On the other hand, if the total content of the molybdenum compound is more than 5 parts by mass, the heat resistance of the laminate may be reduced.

From the viewpoint of reducing CTE and improving drilling workability and moldability, the content of the inorganic filler in the resin composition is preferably in a range from 15 parts by mass to 400 parts by mass, inclusive, with respect to 100 parts by mass of the resin component.

The inorganic filler may contain another filler different from the crushed silica and the molybdenum compound particles. That is, the addition of the other filler enables CTE to be further reduced, in addition to a decreasing effect on CTE by the crushed silica. Further, it is possible to impart characteristics such as flame retardancy and thermal conductivity, which are not sufficiently obtained by using only the crushed silica. The other filler may be appropriately selected from known fillers depending on purposes, and is not particularly limited. However, a filler with relatively low hardness is preferred which is hard to reduce drilling workability. Specific examples of the preferable filler include spherical silica, aluminum hydroxide, magnesium hydroxide, aluminum silicate, magnesium silicate, talc, clay, and mica.

Among the fillers, spherical silica is preferably used as the other filler. When the spherical silica is used as the other filler, the whole of the filler other than the molybdenum compound particles can be a silica component. In particular, the upper limit of the content of the crushed silica is 150 parts by mass, and thus in the case of using the silica component as the inorganic filler in an amount of more than 150 parts by mass with respect to 100 parts by mass of the resin component, the spherical silica may be used as the residue of the silica component in an amount of more than 150 parts by mass.

Thus, even if the spherical silica is used together in addition to the crushed silica and the molybdenum compound particles, this case has still cost advantages compared to the case of using the spherical silica as the whole inorganic filler component, because the crushed silica is relatively less expensive than the spherical silica. Further, the shape of the spherical silica does not place a burden on the drill blade, and thus there is no possibility that drilling workability may be largely reduced, compared to the case where the crushed silica is used in an amount more than the above upper limit (150 parts by mass).

Next, a method for preparing the resin composition will be described. It is possible to prepare the resin composition into a resin varnish in such a manner that predetermined amounts of a resin component, an inorganic filler, and other components to be blended if necessary are prepared, these materials are blended in a solvent, and then the resulting mixture is stirred and mixed. The resin composition contains a thermosetting resin, a curing agent or the like, whereas the inorganic filler contains crushed silica and molybdenum compound particles. In this case, a resin varnish containing only the resin component except the inorganic filler is previously prepared as a base resin, and then the inorganic filler may be blended with the base resin. Examples of the solvent that can be used include ethers such as ethylene glycol monomethyl ether, acetone, methyl ethyl ketone (MEK), dimethylformamide, benzene, and toluene.

Next, prepreg 10 according to the exemplary embodiment will be described with reference to FIG. 1. FIG. 1 is a cross-sectional view of prepreg 10. Prepreg 10 can be produced by impregnating base material 4A such as glass cloth with the resin composition in the form of a varnish obtained in the above manner, thereafter semi-hardening the resin composition by drying the resin composition at a temperature from 110 to 140° C. under heat so as to remove the solvent in the varnish. Therefore, prepreg 10 has base material 4A and resin composition 2A with which base material 4A is impregnated and which is semi-hardened thereafter. At this time, it is preferable to adjust a content of the resin composition in the prepreg within a range from 30% by mass to 80% by mass, inclusive, with respect to the total amount of the prepreg.

Figure 2:
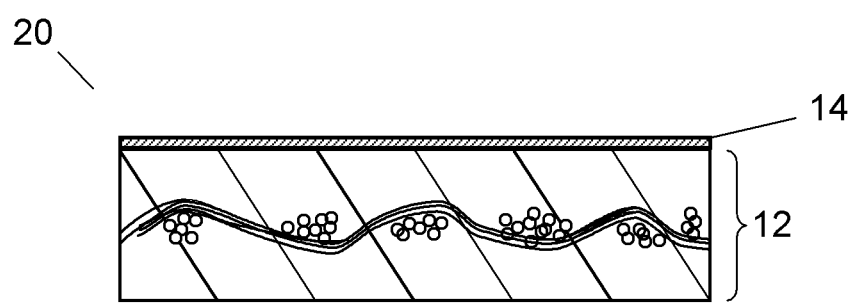
FIG. 2 is a schematic cross sectional view of a metal-clad laminate according to the exemplary embodiment of the present invention.

Next, metal-clad laminate 20 according to the exemplary embodiment will be described with reference to FIG. 2. FIG. 2 is a cross-sectional view of metal-clad laminate 20. Metal-clad laminate 20 can be produced by laminating metal foil 14 such as copper foil on prepreg 10 obtained in the above manner to form a laminated body, and heat press-molding the laminated body to form an integrated body. Therefore, metal-clad laminate 20 has insulating layer 12 as a hardened substance of prepreg 10 and metal foil 14 laminated on insulating layer 12. The metal-clad laminate may be molded by laminating metal foil 14 on both surfaces of a sheet of prepreg 10 and heat-pressing the laminated body. Alternatively, the metal-clad laminate may be molded by laminating metal foil 14 on one surface or both surfaces of multi-layered prepregs 10 and heat-pressing the laminated body. The heating and pressing conditions are, for example, a temperature from 140 to 200° C., a pressure from 0.5 to 5.0 MPa, and a time from 40 to 240 minutes.

Figure 3:
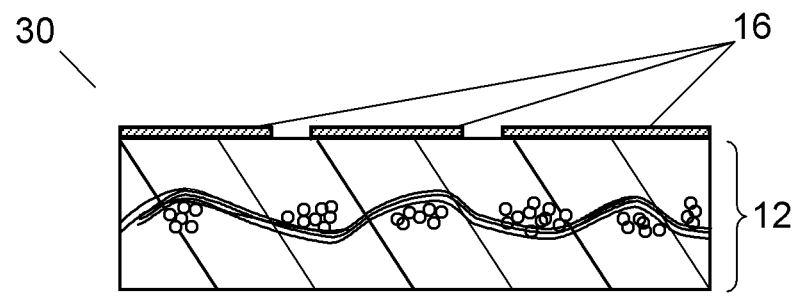
FIG. 3 is a schematic cross sectional view of a printed circuit board according to the exemplary embodiment of the present invention.

Next, printed circuit board 30 according to the exemplary embodiment will be described with reference to FIG. 3. FIG. 3 is a cross-sectional view of printed circuit board 30. Printed circuit board 30 can be produced by removing a part of metal foil 14 of metal-clad laminate 20 by etching using subtractive method or the like to form conductor pattern 16. Therefore, printed circuit board 30 has insulating layer 12 as a hardened substance of prepreg 10 and conductor pattern 16 formed on insulating layer 12.

In the case of producing a multi-layered printed circuit board by laminating prepreg 10 and metal foil 14 on metal-clad laminate 20 shown in FIG. 2 and heat press-molding the laminated body to form an integrated body, it may be necessary to connect a plurality of layers having conductor pattern 16 formed thereon. Thus, holes are formed in insulating layer 12 by a drilling process in order to form through holes or blind via holes. Since insulating layer 12 in which holes are formed is a hardened substance of prepreg 10 (resin composition), drilling workability is good and the wearing out of the drill can be suppressed. Further, insulating layer 12 is made of the hardened substance of prepreg 10, and thus insulating layer 12 is favorably molded and scratches are hardly formed. In addition, insulating layer 12 has high heat resistance and low coefficient of linear thermal expansion.

A multi-layered printed circuit board can be produced by preparing a printed circuit board as a core material (inner layer material) and laminating prepreg 10 on the printed circuit board. In this case, a conductor pattern (inner layer pattern) of the core material is roughened by a black oxide process or the like, and then metal foil 14 is laminated on a surface of the core material with prepreg 10 interposed therebetween, this laminated body is subjected to heat press-molding. At this time, the heating and pressing conditions are also, for example, a temperature from 140 to 200° C., a pressure from 0.5 to 5.0 MPa, and a time from 40 to 240 minutes. The core material may be produced from prepreg 10. Then, holes are formed by drill process and desmear process is carried out. Thereafter, a conductor pattern (outer layer pattern) is formed using subtractive method. Further, inner walls of the holes are plated to form through holes or blind via holes. A multi-layered printed wiring board can be produced in such a procedure. The number of layers of the printed circuit board is not particularly limited.

As described above, the resin composition for printed circuit board according to the exemplary embodiment contains a molybdenum compound together with crushed silica having a predetermined specific surface area in a specific range of content. Thus, as for the metal-clad laminate and printed circuit board produced using the resin composition for printed circuit board, the coefficient of linear thermal expansion of the insulating layer can be decreased while relatively inexpensive crushed silica is used. Additionally, it is possible to realize excellent drilling workability during performing a drilling process.

Hereinafter, the effect of the exemplary embodiment will be further described with reference to specific examples.

[1] Procedure of Producing Laminate for Evaluation (1) Resin Composition

Each of resin compositions in the form of a varnish is prepared by blending a resin component with an inorganic filler in accordance with blending compositions shown in Tables 1 to 4, and further diluting the resulting mixture with a solvent. As the solvent, MEK is used for below-mentioned base resin 1 and toluene is used for below-mentioned base resin 2. Each of the materials is as follows.

<Resin Components (Base Resin 1)>
Phenol novolak-type epoxy resin ("N-770", manufactured by DIC Corporation) Cresol novolak-type phenol resin ("KA-1165", manufactured by DIC Corporation)
2-ethyl-4-methylimidazole ("2E4MZ", manufactured by Shikoku Chemicals Corporation)

TABLE 1

| Content of base resin 1 | Product name | Part(s) by mass |
|---|---|---|
| Phenol novolak-type epoxy resin | N-770 (DIC) | 64 |
| Cresol novolak-type phenol resin | KA-1165 (DIC) | 36 |
| 2-ethyl 4-methylimidazole | 2E4MZ | 0.2 |

<Resin Components (Base Resin 2)>
Cyanate ester resin ("BADCy", manufactured by Lonza, 2,2-bis-(4-cyanatephenyl)propane)
Dicyclopentadiene type epoxy resin ("HP7200", manufactured by DIC Corporation)
Polyphenylene ether (PPE) resin ("SA90", manufactured by SABIC Innovative Plastics)
Metal soap (zinc octanoate)

TABLE 2

| Content of base resin 2 | Product name | Part(s) by mass |
|---|---|---|
| Cyanate ester resin | BADCy | 30 |
| Dicyclopentadiene-type epoxy resin | HP7200 | 42 |
| Polyphenylene ether resin | SA90 | 28 |
| Metal soap | Zinc octanoate | 0.01 |

<Inorganic Filler>
Silica particles are selected from the following five kinds of silica particles and used.
Spherical silica ("SC2500-SEJ", manufactured by Admatechs, specific gravity: 2.2 g/cm$^3$)
Crushed silica 1 ("AS-1-SSA", manufactured by Tatsumori Ltd., specific surface area: 20 m$^2$/g, specific gravity: 2.2 g/cm$^3$)
Crushed silica 2 ("MC3000", manufactured by Admatechs, specific surface area: 15 m$^2$/g, specific gravity: 2.2 g/cm$^3$)
Crushed silica 3 ("MC6000", manufactured by Admatechs, specific surface area: 10 m$^2$/g, specific gravity: 2.2 g/cm$^3$)
Crushed silica 4 ("Megasil525", manufactured by Sibelco, specific surface area: 2.2 m$^2$/g, specific gravity: 2.2 g/cm$^3$)

As the molybdenum compound particles, zinc molybdate-treated talc ("KEMGARD911C", manufactured by Sherwin-Williams Company) is used. An amount of zinc molybdate is 17% by mass, the specific gravity is 2.8 g/cm$^3$, and the average particle diameter is 3.0 μm.

(2) Prepreg

As the base material, a glass base material manufactured by Nitto Boseki Co., Ltd. (WEA116ES136, 0.1 μm in thickness) is used. The base material is impregnated with a resin composition in the form of a varnish at room temperature and dried at a temperature from 150 to 160° C. Thus, the solvent in the varnish is removed and the resin composition is semi-hardened to produce a prepreg. The resin content (resin amount) in the prepreg is 56% by mass.

(3) Laminate

Six prepregs (300 mm×450 mm) are laminated, and further, copper foil as metal foil (manufactured by Mitsui Mining and Smelting Co., Ltd., 35 μm in thickness) is laminated on both sides of the laminated prepregs, followed by heat press-molding at 200° C. and 3 MPa for 90 minutes. A laminate for evaluation (0.8 mm in thickness) is produced in such a procedure.

[2] Evaluation of Laminate and Result Thereof (1) Scratches after Molding

Copper foil layers on both surfaces of the laminate having a thickness of 0.8 mm are removed by etching and then the presence or absence of scratches is visually checked.

(2) Drill Wear Rate

Four laminates each having a thickness of 0.8 mm are laminated. A 0.15-mm thick aluminum plate is used as an entry board and a 0.15-mm thick bakelite board is used as a backup board. A 5000 hit drilling process is performed using a drill having a diameter of 0.3 mm to form through holes. Then, the drill wear rate after the drilling process is measured.

As the drill, "NHU L020W", manufactured by Union Tool, Co is used. A rotating speed of the drill during making holes is 160000 r.p.m, and a feeding speed of the drill is 3.2 m/minute.

(3) Coefficient of Linear Thermal Expansion (CTE)

Copper foil layers on both surfaces of a 0.8-mm thick laminate are removed by etching and then the coefficient of linear thermal expansion in the thickness direction at a temperature of less than the glass transition temperature (Tg) is measured by TMA (thermal mechanical analysis) method based on IPC TM650 2.4.24.

(4) Heat Resistance T-288

Copper foil layers on both surfaces of a 0.8-mm thick laminate are removed by etching, and then the time when the degradation of the hardened substance of the resin composition starts at 288° C. is determined.

The above evaluation results are shown in Tables 3 and 4.

TABLE 3

| | | | | Sample | | | | |
|---|---|---|---|---|---|---|---|---|
| | Contents | Product name | Unit | EA | EB | EC | ED | EE |
| Resin component | Base resin 1 | Refer to Table 2 | Parts by mass | 100 | 100 | 100 | 100 | |
| | Base resin 2 | Refer to Table 3 | Parts by mass | | | | | 100 |
| Inorganic filler | Spherical silica | SC2500-SEJ | Parts by mass | | | | | |
| | Crushed silica 1 (specific surface area 20 m$^2$/g) | AS-1 SSA (Tatsumori Ltd) | Parts by mass | | | | | |
| | Crushed silica 2 (specific surface area 15 m$^2$/g) | MC3000 | Parts by mass | 50 | | | | |

TABLE 3-continued

|  |  |  |  |  |  |  |  |
|---|---|---|---|---|---|---|---|
|  | Crushed silica 3 (specific surface area 10 m²/g) | MC6000 | Parts by mass |  | 50 |  |  |
|  | Crushed silica 4 (specific surface area 2.2 m²/g) | Megasil525 | Parts by mass |  |  | 50 | 150 | 50 |
|  | Molybdenum compound particles | 911C Zinc molybdate treated talc | Parts by mass | 1.8 | 1.8 | 1.8 | 8 | 1.8 |
| Content of molybdenum compound particles with respect to 100% by volume of total amount of inorganic filler |  |  | % by volume | 2.75 | 2.75 | 2.75 | 4.02 | 2.75 |
| Content of molybdenum compound particles with respect to 100 parts by mass of resin component |  |  | Part(s) by mass | 0.31 | 0.31 | 0.31 | 1.36 | 0.31 |
| Evaluation results | Scratches after molding | — |  | A | A | A | A | A |
|  | Drill wear rate |  | % | 64 | 64 | 65 | 65 | 65 |
|  | CTE |  | ppm/° C. | 45 | 45 | 45 | 30 | 42 |
|  | T-288 |  | min | 34 | 34 | 34 | 33 | 32 |

|  |  |  |  | Sample |  |  |  |  |
|---|---|---|---|---|---|---|---|---|
|  | Contents | Product name | Unit | EF | EG | EH | EI | EJ |
| Resin component | Base resin 1 | Refer to Table 2 | Parts by mass | 100 | 100 | 100 | 100 | 100 |
|  | Base resin 2 | Refer to Table 3 | Parts by mass |  |  |  |  |  |
| Inorganic filler | Spherical silica | SC2500-SEJ | Parts by mass | 75 | 75 | 37.5 | 37.5 | 100 |
|  | Crushed silica 1 (specific surface area 20 m²/g) | AS-1 SSA (Tatsumori Ltd) | Parts by mass |  |  |  |  |  |
|  | Crushed silica 2 (specific surface area 15 m²/g) | MC3000 | Parts by mass |  |  |  |  |  |
|  | Crushed silica 3 (specific surface area 10 m²/g) | MC6000 | Parts by mass |  |  |  |  |  |
|  | Crushed silica 4 (specific surface area 2.2 m²/g) | Megasil525 | Parts by mass | 75 | 75 | 112.5 | 112.5 | 150 |
|  | Molybdenum compound particles | 911C Zinc molybdate treated talc | Parts by mass | 8 | 4 | 8 | 5 | 21 |
| Content of molybdenum compound particles with respect to 100% by volume of total amount of inorganic filler |  |  | % by volume | 7.73 | 4.02 | 7.73 | 4.98 | 9.91 |
| Content of molybdenum compound particles with respect to 100 parts by mass of resin component |  |  | Part(s) by mass | 1.36 | 0.68 | 1.36 | 0.85 | 3.57 |
| Evaluation results | Scratches after molding | — |  | A | A | A | A | A |
|  | Drill wear rate |  | % | 58 | 62 | 64 | 67 | 70 |
|  | CTE |  | ppm/° C. | 30 | 30 | 30 | 30 | 23 |
|  | T-288 |  | min | 33 | 35 | 33 | 35 | 29 |

A: Absence

TABLE 4

|  |  |  |  | Sample |  |  |  |  |  |
|---|---|---|---|---|---|---|---|---|---|
|  | Contents | Product name | Unit | CA | CB | CC | CD | CE | CF |
| Resin component | Base resin 1 | Refer to Table 2. | Parts by mass | 100 | 100 | 100 | 100 | 100 | 100 |
|  | Base resin 2 | Refer to Table 3. | Parts by mass |  |  |  |  |  |  |
| Inorganic filler | Spherical silica | SC2500-SEJ | Parts by mass | 50 | 50 |  |  |  |  |
|  | Crushed silica 1 (specific surface area 20 m²/g) | AS-1 SSA (Tatsumori Ltd) | Parts by mass |  |  | 50 | 150 |  |  |
|  | Crushed silica 2 (specific surface area 15 m²/g) | MC3000 | Parts by mass |  |  |  |  | 50 |  |
|  | Crushed silica 3 (specific surface area 10 m²/g) | MC6000 | Parts by mass |  |  |  |  |  | 50 |
|  | Crushed silica 4 (specific surface area 2.2 m²/g) | Megasil525 | Parts by mass |  |  |  |  |  |  |
|  | Molybdenum compound particles | 911-C Zinc molybdate-treated talc | Parts by mass |  | 1.8 | 1.8 | 8 |  |  |
| Content of molybdenum compound particles with respect to 100% by volume of total amount of inorganic filler |  |  | % by volume |  | 2.75 | 2.75 | 4.02 |  |  |
| Content of molybdenum compound particles with respect to 100 parts by mass of resin component |  |  | Part(s) by mass |  | 0.31 | 0.31 | 1.36 |  |  |
| Evaluation results | Scratches after molding | — |  | A | A | P | P | A | A |
|  | Drill wear rate |  | % | 62 | 54 | 65 | 64 | 73 | 73 |
|  | CTE |  | ppm/° C. | 45 | 45 | 45 | 30 | 45 | 45 |
|  | T-288 |  | min | 35 | 34 | 34 | 33 | 35 | 35 |

TABLE 4-continued

|  | Contents | Product name | Unit | Sample CG | CH | CI | CJ | CK | CL |
|---|---|---|---|---|---|---|---|---|---|
| Resin component | Base resin 1 | Refer to Table 2. | Parts by mass | 100 | 100 | 100 | 100 | | |
|  | Base resin 2 | Refer to Table 3. | Parts by mass | | | | | 100 | 100 |
| Inorganic filler | Spherical silica | SC2500-SEJ | Parts by mass | | | | | 50 | |
|  | Crushed silica 1 (specific surface area 20 m²/g) | AS-1 SSA (Tatsumori Ltd) | Parts by mass | | | | | | |
|  | Crushed silica 2 (specific surface area 15 m²/g) | MC3000 | Parts by mass | | | | | | |
|  | Crushed silica 3 (specific surface area 10 m²/g) | MC6000 | Parts by mass | | | | | | |
|  | Crushed silica 4 (specific surface area 2.2 m²/g) | Megasil525 | Parts by mass | 50 | 150 | 200 | 200 | | 50 |
|  | Molybdenum compound particles | 911-C Zinc molybdate-treated talc | Parts by mass | | 75 | 90 | 25 | | |
| Content of molybdenum compound particles with respect to 100% by volume of total amount of inorganic filler | | | % by volume | | 28.21 | 26.12 | 8.94 | | |
| Content of molybdenum compound particles with respect to 100 parts by mass of resin component | | | Part(s) by mass | | 12.75 | 15.3 | 4.25 | | |
| Evaluation results | Scratches after molding | | — | A | A | A | A | A | A |
|  | Drill wear rate | | % | 74 | 45 | 59 | 79 | 64 | 75 |
|  | CTE | | ppm/° C. | 45 | 30 | 26 | 26 | 42 | 42 |
|  | T-288 | | min | 35 | 1 | 8 | 30 | 32 | 32 |

A: Absence
P: Presence

As is clear from Tables 3 and 4, despite the fact that crushed silica is used, the laminates of samples EA to EE have excellent drilling workability, moldability, and heat resistance as well as low coefficient of linear thermal expansion, which are comparable to the cases of using spherical silica (samples CA, CB, and CK).

In particular, in comparison of sample EA with sample CE, comparison of sample EB with sample CF, comparison of sample EC with sample CG, and comparison of sample EE with sample CL, it is found that the combination use of predetermined crushed silica specified by the exemplary embodiment and molybdenum compound particles achieves good drilling workability.

The comparison of sample ED with sample CH shows that an excessive content of the molybdenum compound particles results in a significant reduction in heat resistance.

The laminates of samples EF to EJ obtained by using crushed silica in combination with spherical silica are also excellent in drilling workability, moldability, and heat resistance, and have low coefficient of linear thermal expansion.

In samples CC and CD obtained by using crushed silica having a large specific surface area, the resin flowability during molding is assumed to be reduced and scratches after molding are observed.

In samples CI and CJ, the content of crushed silica is more than 150 parts by mass. In sample CI, the content of molybdenum compound particles is increased, whereby the drill wear rate is reduced. However, the heat resistance (T-288) is largely reduced. On the other hand, the heat resistance of sample CJ in which the content of molybdenum compound particles is reduced is not largely reduced; however, the drill wear rate is increased to more than 70%.

(Exemplary Embodiment 2)

Prior to the explanation of the second exemplary embodiment of the present invention, problems in conventional constitutions will be described. Even when the resin composition disclosed in PTL 3 is used, it may cause a significant reduction in glass transition temperature and dielectric loss tangent of a hardened substance. For example, in the case of using moisture-absorbed silica particles, the glass transition temperature and dielectric characteristics of a hardened substance are reduced with time. On the other hand, in the case of using new silica particles (silica particles in a dry state), a hardened substance is excellent in glass transition temperature and dielectric loss tangent.

In the present exemplary embodiment, a resin composition for printed circuit board which is stably excellent in glass transition temperature and dielectric characteristics and has excellent drilling workability and moldability will be described based on the above knowledge.

The resin composition for printed circuit board according to the present exemplary embodiment (hereinafter, "resin composition") is prepared by blending a resin component including (a) and (b) mentioned below with an inorganic filler containing (c) and (d) mentioned below:

(a) a preliminary reaction product obtained by reacting polyphenylene ether with an epoxy compound having an epoxy group;
(b) a cyanate ester compound;
(c) surface-treated hydrophobic silica particles; and
(d) molybdenum compound particles each having a molybdenum compound in at least a surface layer portion.

In other words, the resin composition is prepared by first reacting polyphenylene ether with an epoxy compound to form preliminary reaction product (a), and then blending cyanate ester compound (b), hydrophobic silica particles (c), and molybdenum compound particles (d) with the reaction product. Accordingly, the epoxy compound is previously reacted with polyphenylene ether to form preliminary reaction product (a), so that it is possible to make the glass transition temperature of a hardened substance of the resin composition (hereinafter, "hardened substance") higher than that of a resin composition obtained without forming the preliminary reaction product. Further, the hardened substance is excellent in dielectric characteristics such as dielectric constant and dielectric loss tangent because of containing the resin component as a base resin.

An amount of water contained in the resin composition is preferably less than 0.1%, and more preferably 0.07% by mass or less with respect to the total mass of the resin composition. When the amount of water contained in the resin composition is within the above range, the gel time of a resin composition in the form of a varnish is hardly shortened. If the varnish gel time is short, the resin composition is not sufficiently heated at the time of hardening the resin composition, whereby a large amount of volatile substances remain in the hardened substance. Accordingly, the glass transition temperature of the hardened substance may be largely reduced. The amount of water contained in the resin composition is mainly originated from water absorbed by the silica particles. Thus, in the case where surface treatment is not performed on the silica particles, a relatively large amount of water is contained in the resin composition.

When the amount of water contained in the resin composition is large, the gel time of the resin composition in the form of a varnish is significantly shortened. This phenomenon is typical of the resin composition containing preliminary reaction product (a), cyanate ester compound (b), hydrophobic silica particles (c), and molybdenum compound particles (d). This phenomenon is not observed, for example, in a resin composition prepared by polymerizing polyphenylene ether, an epoxy compound, cyanate ester compound (b), hydrophobic silica particles (c), and molybdenum compound particles (d) without using preliminary reaction product (a).

A large amount of water contained in the resin composition results in shortened gel time of varnish, and this is assumed to be due to the fact that a trimerization reaction of the cyanate ester from cyanate ester compound (b) is promoted. In other words, a large amount of water contained in the resin composition allows cyanate ester compound (b) to be easily reacted with water, so that carbamate is easily generated. Active hydrogen in this carbamate and the molybdenum compound significantly promote the trimerization reaction of the cyanate ester from cyanate ester compound (b) to form a triazine ring. It is assumed that the triazine ring serves as a curing agent and the resin composition gelates easily.

A gel time of the resin composition in the form of a varnish is necessary to be 120 seconds or more, preferably from 120 to 240 seconds, and more preferably from 150 to 210 seconds. In the exemplary embodiment, the varnish gel time is defined as a time until 2.5 ml of the obtained resin composition in the form of a varnish gelates on a cure plate at 200° C.

An amount of water absorbed by silica particles can be measured in accordance with Karl Fischer method (JIS K0113:2005, coulometric titration method). The amount of water to enter the resin composition can be calculated by the following calculation formula:

Amount of water to enter resin composition= (amount of water contained in silica (Karl-Fischer measurement value %)×added amount of silica/total amount of resin composition)×100

Subsequently, the resin component will be described. The resin component contains preliminary reaction product (a) and cyanate ester compound (b). First, preliminary reaction product (a) will be described. Preliminary reaction product (a) is prepared by reacting polyphenylene ether (a-1) with epoxy compound (a-2) having an epoxy group.

Polyphenylene ether (a-1) preferably has hydroxyl groups per molecule of an average number of 1.5 to 2. The term "having hydroxyl groups per molecule of an average number of 1.5 to 2" means that the average number of hydroxyl groups per molecule (average number of hydroxyl groups) is from 1.5 to 2. When the average number of hydroxyl groups is 1.5 or more, the hydroxyl groups are reacted with an epoxy group on epoxy compound (a-2) and a three-dimensional cross-linkage is formed. Thus, the adhesion during hardening is improved. Further, it is assumed that when the average number of hydroxyl groups is 2 or less, a possibility of gelation during the preliminary reaction is eliminated.

The average number of hydroxyl groups on polyphenylene ether (a-1) is apparent from product specifications for polyphenylene ether to be used. The average number of hydroxyl groups on polyphenylene ether (a-1) is, for example, an average of hydroxyl groups per molecule in all polyphenylene ether molecules present in 1 mol of polyphenylene ether.

Polyphenylene ether (a-1) preferably has a number average molecular weight (Mn) from 800 to 2000, inclusive. When the number average molecular weight is 800 or more, it is possible to ensure the dielectric characteristics, heat resistance, high glass transition temperature of the hardened substance. When the number average molecular weight is 2000 or less, resin flow and phase separation can be prevented from occurring and moldability can be prevented from reducing even in the case where a preliminary reaction product obtained by reaction with an epoxy resin having a relatively small number of epoxy groups is contained.

Polyphenylene ether having a number average molecular weight from 800 to 2000, inclusive, can be prepared, for example, by a direct polymerization reaction. Alternatively, it may be obtained by a redistribution reaction of polyphenylene ether having a number average molecular weight of 2000 or more in the presence of a phenol compound and a radical initiator in a solvent. The number average molecular weight (Mn) of polyphenylene ether (a-1) may be measured using a technique such as gel permeation chromatography.

Examples of polyphenylene ether (a-1) include poly(2,6-dimethyl-1,4-phenylene oxide), and polyphenylene ether having a molecular structure synthesized by 2,6-dimethylphenol and at least one of a bifunctional phenol or a trifunctional phenol. Among the polyphenylene ethers, the latter polyphenylene ether having a molecular structure synthesized by 2,6-dimethylphenol and at least one of a bifunctional phenol or a trifunctional phenol is preferred. An example of the bifunctional phenol includes tetramethyl bisphenol A.

Epoxy compound (a-2) preferably has epoxy groups per molecule of an average number of 2 to 2.3. When the average number of epoxy groups is within this range, a preliminary reaction product with polyphenylene ether (a-1) can be favorably produced while the heat resistance of the hardened substance is maintained.

Examples of epoxy compound (a-2) include dicyclopentadiene (DCPD) type epoxy resins, bisphenol A-type epoxy resins, bisphenol F-type epoxy resins, phenol novolak-type epoxy resins, naphthalene-type epoxy resins, and biphenyl type epoxy resins. These compounds may be used singly, or in combination of two or more kinds thereof. Among the compounds, DCPD-type epoxy resins are particularly preferable from the viewpoint of improving dielectric characteristics. Further, bisphenol A-type epoxy resins and bisphenol F-type epoxy resins are preferable in terms of having good compatibility with polyphenylene ether. From the viewpoint of heat resistance, it is preferable that the resin composition contains no halogenated epoxy resin. If necessary, a halogenated epoxy resin may be blended in a range that does not impair the effect of the present invention.

The average number of epoxy groups on epoxy compound (a-2) is apparent from product specifications for an epoxy resin to be used. The average number of epoxy groups on the epoxy resin is, for example, an average number of epoxy groups per molecule in all epoxy resin molecules present in 1 mol of epoxy resin.

Epoxy compound (a-2) has a solubility in toluene at 25° C. of preferably 10% by mass or more. Accordingly, it is considered that the compatibility between epoxy compound (a-2) and polyphenylene ether (a-1) is relatively high, and epoxy compound (a-2) uniformly reacts with polyphenylene ether (a-1). As a result, the heat resistance of the hardened substance is sufficiently increased without inhibiting excellent dielectric characteristics of polyphenylene ether (a-1).

Preliminary reaction product (a) is prepared, for example, by the following reaction. Polyphenylene ether (a-1) and epoxy compound (a-2) are first weighed at a predetermined ratio. These compounds are stirred and mixed in an organic solvent at a solid content concentration in or around a range from 50 to 70% for about 10 to 60 minutes. This mixture is heated at a temperature from 80 to 110° C. for 2 to 12 hours so as to react polyphenylene ether (a-1) with epoxy compound (a-2). Thus, preliminary reaction product (a) is prepared. There is no limitation as to the organic solvent as long as it dissolves polyphenylene ether (a-1), epoxy compound (a-2) and the like, and does not interfere with their reaction. For example, toluene may be used as the organic solvent.

There is a preferable range of ratio between polyphenylene ether (a-1) and epoxy compound (a-2). When this ratio is expressed as a molar ratio of epoxy groups on epoxy compound (a-2) with respect to hydroxyl groups on polyphenylene ether (a-1) (epoxy group/hydroxyl groups), the ratio is preferably from 3 to 6, inclusive, and more preferably in or around a range from 3.5 to 5.5, inclusive. When the molar ratio is within the above range, both ends of polyphenylene ether (a-1) can be efficiently capped with epoxy groups. Further, the viscosity of preliminary reaction product (a) reduces, as a result of which the viscosity of varnish or prepreg described later is lowered, and productivity is enhanced.

When polyphenylene ether (a-1) is reacted with epoxy compound (a-2), a catalyst may be coexisted. The catalyst is not particularly limited as long as the catalyst can promote the reaction between hydroxyl groups on polyphenylene ether (a-1) and epoxy groups on epoxy compound (a-2). Examples of the catalyst include metal salts of organic acids, tertiary amines, imidazoles, and organic phosphines. Examples of the metal salts of organic acids include metal salts such as Zn, Cu, and Fe salts of organic acids such as octanoic acid, stearic acid, acetylacetonate, naphthenic acid, and salicylic acid. Examples of the tertiary amines include 1,8-diazabicyclo[5.4.0]undecene-7 (DBU), triethylamine, and triethanolamine. Examples of the imidazoles include 2-ethyl-4-imidazole (2E4MZ) and 4-methylimidazole. Examples of the organic phosphines include triphenyl phosphine (TPP), tributyl phosphine, and tetraphenylphosphonium tetraphenylborate. These catalysts may be used singly, or in combination of two or more kinds thereof. Among the catalysts, imidazoles are preferred, and in particular, 2-ethyl-4-imidazole is preferred in terms of being capable of shortening the reaction time and suppressing polymerization between epoxy resins (epoxy resin self-polymerization). A content of the catalyst is preferably from 0.05 part by mass to 1 part by mass, inclusive, with respect to 100 parts by mass of the total of polyphenylene ether (a-1) and epoxy compound (a-2). When the content of the catalyst is within the above range, the reaction of hydroxyl groups on polyphenylene ether (a-1) with epoxy groups of epoxy compound (a-2) does not take a long time. Further, the reaction is easy controlled and gelation hardly occurs.

When taking reaction efficiency and viscosity (manufacturability) into consideration, a solid content concentration during the reaction is preferably in or around a range from 50% to 70%.

Subsequently, cyanate ester compound (b) will be described. Cyanate ester compound (b) preferably has cyanate groups per molecule of an average number (average number of cyanate groups) of 2 or more. Thus, the heat resistance of the hardened substance can be improved. Herein, the average number of cyanate groups is an average of cyanate groups in all cyanate resin molecules present in 1 mol of cyanate resin used as cyanate ester compound (b). The average number of cyanate groups is apparent from product specifications for cyanate resin.

Examples of cyanate ester compound (b) include 2,2-bis(4-cyanatephenyl)propane (bisphenol A-type cyanate resin), bis(3, 5-dimethyl-4-cyanatephenyl)methane, 2,2-bis(4-cyanatephenyl)ethane, and aromatic cyanate ester compounds such as derivatives of the above compounds. These compounds may be used singly, or in combination of two or more kinds thereof.

It is preferable that the resin composition further contains epoxy compound (e). Epoxy compound (e) preferably has epoxy groups per molecule of an average number from 2 to 2.3, inclusive, similarly to epoxy compound (a-2). Examples of epoxy compound (e) include DCPD-type epoxy resins, bisphenol A-type epoxy resins, bisphenol F-type epoxy resins, phenol novolak-type epoxy resins, naphthalene-type epoxy resins, and biphenyl-type epoxy resins. These resins may be used singly, or in combination of two or more kinds thereof. In this case, epoxy compound (e) may be the same as or different from epoxy compound (a-2). From the viewpoint of improving dielectric characteristics, epoxy compound (e) is preferably a DCPD-type epoxy resin.

As alternative to the epoxy compound having epoxy groups per molecule of an average number from 2 to 2.3, inclusive, an epoxy compound having epoxy groups per molecule of an average number of more than 2.3 may also be used among polyfunctional-type epoxy compounds such as cresol novolak-type epoxy resin.

In the case where the resin composition contains a DCPD-type epoxy resin as epoxy compound (a-2) and/or epoxy compound (e), a content of the DCPD-type epoxy compound is preferably 50% by mass or more with respect to the total mass of epoxy compound (a-2) and epoxy compound (e). This makes it possible to produce an insulating material having excellent dielectric characteristics.

In the case where the total of polyphenylene ether (a-1), epoxy compound (a-2), cyanate ester compound (b), and epoxy compound (e) is 100 parts by mass (including the case where no epoxy compound (e) is blended), a preferable blending ratio of the resin component is, for example, as follows. The blending ratio of polyphenylene ether (a-1) is from 10 to 40 parts by mass, inclusive, the blending ratio of epoxy compound (a-2) and epoxy compound (e) is from 20 to 60 parts by mass, inclusive, and the blending ratio of cyanate ester compound (b) is from 20 to 40 parts by mass, inclusive. In the case where no epoxy compound (e) is blended, the amount of epoxy compound (a-2) is preferably from 20 to 60 parts by mass, inclusive. It is assumed that the blending ratio simultaneously achieves excellent dielectric characteristics, heat resistance, and adhesion (adhesiveness) of the hardened substance.

The resin composition may further contain a halogenated flame retardant or a non-halogenated flame retardant. Thus, flame retardancy of the hardened substance is increased. In the case of using a halogenated flame retardant, flame retardancy can be imparted to the hardened substance, and glass transition temperature of the hardened substance hardly lowers, thus, a large decline in heat resistance hardly occurs. The use of a halogenated flame retardant allows for imparting flame retardancy to the hardened substance easily, even in the case where a DCPD-type epoxy resin to which it is difficult to impart flame retardancy is used.

The halogenated flame retardant preferably disperses without dissolving in a varnish described later. Examples of the halogenated flame retardant include ethylene dip entabromobenzene, ethylene bistetrabromoimide, decabromodiphenyloxide, and tetradecabromodiphenoxybenzene, all of which have a melting point of 300° C. or higher. It is considered that the use of such halogenated flame retardants enables halogen elimination at elevated temperatures to be suppressed and thus enables a decline in heat resistance to be suppressed.

The halogenated flame retardant is preferably contained in a proportion such that a halogen concentration in the total amount of the resin component is in or around a range from 5 to 30% by mass from the viewpoint of flame retardancy and heat resistance.

Subsequently, the inorganic filler will be described. The inorganic filler contains surface-treated hydrophobic silica particles (c) and molybdenum compound particles (d) each having a molybdenum compound in at least a surface layer portion. First, hydrophobic silica particles (c) will be described.

Hydrophobic silica particles (c) hardly absorb moisture in an environment of high temperature or high humidity. Accordingly, even if hydrophobic silica particles (c) left (stored) at room temperature for a long period of time is used as materials of the resin composition, moisture hardly enters the resin composition. As a result, it is possible to maintain a varnish gel time equivalent to the gel time of silica particles in a dry state. That is, the glass transition temperature and dielectric characteristics of the hardened substance hardly decrease with time depending on a storage state of silica particles. Thus, the glass transition temperature and the dielectric characteristics are stably excellent. Herein, the term "silica particles in a dry state" means silica particles having an amount of water measured by Karl Fischer's method of less than 0.1%.

Examples of a surface treatment agent used for surface treatment include known surface treatment agents such as a silane coupling agent and silicone oil. Examples of the silane coupling agent include silane coupling agents such as β-ethyltrimethoxysilane, γ-glycidoxypropyltrimethoxysilane, γ-glycidoxypropylmethyldiethoxysilane, hexamethyldisilazane, and dimethyldichlorosilane. Further, hydrophobic silica particles (c) are commercially available and, for example, "Megasil 525RCS" manufactured by Sibelco Japan may be used.

Examples of the silica particles constituting hydrophobic silica particles (c) include spherical silica and crushed silica. Among the silica particles, spherical silica or crushed silica having a specific surface area in a range from 0.1 $m^2/g$ to 15 $m^2/g$, inclusive, is preferable in terms of further improving drilling workability of the hardened substance as described in the first exemplary embodiment. Crushed silica having a specific surface area in a range from 0.1 $m^2/g$ to 15 $m^2/g$, inclusive, is more preferable from the economical viewpoint.

When the crushed silica having a specific surface area of 0.1 $m^2/g$ or more is used in combination with molybdenum compound particles (d), it is possible to allow a laminate such as a metal-clad laminate produced by using the resin composition to have excellent drilling workability. On the other hand, when the crushed silica has a specific surface area of 15 $m^2/g$ or less, the resin composition in the form of a varnish is prevented from thickening and also the melt viscosity during hot molding is prevented from increasing. Thus, the resin flowability reaches an appropriate range and the moldability during laminate production is excellent. These effects are the same as those of the first exemplary embodiment.

As described above, it is possible to combine the characteristics of the present exemplary embodiment with the first exemplary embodiment. In this case, the resin component contains a preliminary reaction product obtained by reacting polyphenylene ether with an epoxy compound having an epoxy group and a cyanate ester compound. The inorganic filler contains crushed silica having a specific surface area in a range from 0.1 $m^2/g$ to 15 $m^2/g$, inclusive, and a hydrophobic-treated surface, and molybdenum compound particles each having a molybdenum compound in at least a surface layer portion. Accordingly, it is possible to produce a hardened substance which is stably excellent in glass transition temperature and dielectric characteristics and has high levels of drilling workability and moldability.

A content range of hydrophobic silica particles (c) is preferably from 10 to 200 parts by mass, inclusive, more preferably from 10 to 150 parts by mass, inclusive, and even more preferably from 30 to 100 parts by mass, inclusive, with respect to 100 parts by mass of the resin component. When the content of hydrophobic silica particles (c) is within the above range, the coefficient of linear thermal expansion of the hardened substance can be reduced.

In the case where the silica particles constituting hydrophobic silica particles (c) are crushed silica, the content of hydrophobic silica particles (c) is preferably from 10 to 150 parts by mass, inclusive, and more preferably from 20 to 100 parts by mass, inclusive, with respect to 100 parts by mass of the resin component. The reason for this is the same as that of the first exemplary embodiment.

A combination the specific surface area and content of the crushed silica of the crushed silica is not limited as long as they are within the above ranges. In particular, when the specific surface area of the crushed silica is from 9 to 15 $m^2/g$, inclusive, the content of the crushed silica is preferably from 10 to 100 parts by mass, inclusive, with respect to 100 parts by mass of the resin component. In a case where the specific surface area of the crushed silica is large, the melt viscosity of the resin composition during molding tends to increase. Therefore, it is preferable to reduce the content of the crushed silica in order to ensure the fluidity of the resin composition.

Since molybdenum compound particles (d) are the same as those of the first exemplary embodiment, a description will be omitted.

The resin composition may further contain a catalyst. Accordingly, it is possible to accelerate a hardening reaction (crosslinking reaction) between preliminary reaction product (a) and cyanate ester compound (b). In other words, the catalyst acts as a curing accelerator. Therefore, it is possible to ensure high glass transition temperature, heat resistance and adhesion of the hardened substance.

As the catalyst, for example, one generally called "metal soap" may be used. Examples of the catalyst include metal salts of organic acids. Examples of the organic acids include octylic acid, naphthenic acid, stearic acid, lauric acid, recinoleic acid, and acetyl acetate. Examples of the metal include zinc, copper, cobalt, lithium, magnesium, calcium, and barium. Among the metal salts of organic acids, copper naphthenate is preferable because a relatively good pot life is given to a varnish or prepreg while retaining heat resistance of the hardened substance due to its low cyanate ester trimerization reaction activity. The catalysts may be used singly, or in combination of two or more kinds thereof.

A blending amount of the catalyst is preferably from 0.001 to 1 part by mass inclusive with respect to 100 parts by mass of the total of preliminary reaction product (a) and cyanate ester compound (b). When the blending amount of the catalyst is within the range, a hardening accelerating effect is increased and thus the high heat resistance and glass transition temperature of the hardened substance can be ensured, as well as prepregs that are free of moldability problems are easily produced.

In addition to hydrophobic silica particles (c) and molybdenum compound particles (d), the inorganic filler may contain another filler that is different from these particles. That is, addition of the other filler provides a more reduction in coefficient of linear thermal expansion in addition to the effect of lowering the coefficient of linear thermal expansion by hydrophobic silica particles (c). Further, characteristics which are not sufficiently obtained only by hydrophobic silica particles (c) such as flame retardancy and thermal conductivity can be imparted to the hardened substance. The other filler may be appropriately selected from known fillers depending on purposes, and is not limited. A preferable filler has relatively low hardness and hardly causes a reduction in drilling workability. Specific examples of the filler include aluminum hydroxide, magnesium hydroxide, aluminum silicate, magnesium silicate, talc, clay, and mica.

For example, additives such as a heat stabilizer, an antistatic agent, an ultraviolet absorber, a dye, a pigment, and a lubricant may be further blended with the resin composition, if necessary, in a range that does not impair the effect of the present invention.

The resin composition may be prepared into a varnish and used the varnish by mixing a predetermined amount of each of the components in a solvent. There is no particular limitation as to the solvent so long as it dissolves resin components such as preliminary reaction product (a), cyanate ester compound (b), and epoxy compound (e) and does not interfere with the hardening reaction. Examples of the solvent include organic solvents such as toluene, cyclohexanone, methyl ethyl ketone, and propylene glycol monomethyl ether acetate.

During the preparation of the resin composition into a varnish, the mixture may be heated in a temperature range that does not cause any hardening reaction of the resin components, if necessary, in order to promote dissolution/dispersion of solid components. In the case of using an inorganic filler and a halogenated flame retardant, if necessary, a ball mill, a bead mill, a planetary mixer or a roll mill may be used to stir the varnish so as to be in a good dispersion state.

Even if the resin composition according to the present exemplary embodiment is used in place of the resin composition in the first exemplary embodiment, a prepreg, a metal-clad laminate, and a printed circuit board can be formed. Since the methods are the same as those of the first exemplary embodiment, a description will be omitted.

Hereinafter, the effect of the exemplary embodiment will be further described with reference to specific examples.

[1] Production Procedure of Laminate for Evaluation
(1) Resin Composition
<Preliminary Reaction Product>
In order to prepare preliminary reaction product (a), the following materials are used.

"SA90", manufactured by SABIC Innovative Plastics (number average molecular weight: 1500, hydroxyl groups: 1.9) is used as polyphenylene ether (PPE).

A DCPD-type epoxy resin is used as an epoxy compound. Specifically, "HP7200", manufactured by DIC Corporation (average number of functional groups per molecule: 2.3) is used.

An imidazole is used as a catalyst. Specifically, "2E4MZ" (2-ethyl-4-imidazole), manufactured by Shikoku Chemicals Corporation is used.

Each of the components is weighed to have blending ratio shown in Table 5 and added to toluene, followed by stirring at 100° C. for 6 hours. That is, polyphenylene ether is previously reacted (pre-reacted) with the epoxy resin to prepare preliminary reaction product (a). The amount of toluene which is a solvent to be added is prepared so that the solid content concentration of preliminary reaction product (a) is 60%.

TABLE 5

| Content of preliminary reaction product PPE (a) | Product name | Part(s) by mass |
|---|---|---|
| PPE | SA90 | 10 |
| DCPD-type epoxy resin | HP7200 | 15 |
| Imidazole | 2E4MZ | 0.03 |

<Cyanate Ester Compound>
In any of samples AA-AF, AH, BA-BI, BP, and BQ, the following materials are used together with preliminary reaction product (a) described above as resin components in order to prepare a resin composition. That is, 2,2-bis(4-cyanatephenyl)propane is used as cyanate ester compound (b). Specifically, the compound is "BADCy", manufactured by Lonza Japan.

In any of samples AG, BJ, and BK, the following materials are used together with preliminary reaction product (a) described above as resin components in order to prepare a resin composition. As cyanate ester compound (b), 2,2-bis(4-cyanatephenyl)propane is used. As epoxy compound (e), a DCPD-type epoxy resin is used. Specifically, "BADCy", manufactured by Lonza Japan and "EPICRON HP7200", manufactured by DIC Corporation (average number of functional groups per molecule: 2.3) are used.

<Catalyst>
Metal soap is used as a catalyst. Specifically, zinc octanoate (Zn-OCTOATE), manufactured by DIC Corporation is used.

<Inorganic Filler>
The silica particles used are selected from seven kinds of crushed silica 1 (c), crushed silica 2 (c), crushed silica 3, spherical silica 1 (c), spherical silica 2 (c), spherical silica 3, and spherical silica 4.

Crushed silica 1 (c) stands for melt-crushed silica particles "Megasil 525RCS", manufactured by Sibelco Japan, has an average particle diameter of 1.6 μm and a specific surface area of 2.1 $m^2/g$, and is surface-treated with epoxysilane.

Crushed silica 2 (c) stands for crushed silica particles obtained by exposing crushed silica 1 to an environment of 35° C. and RH90% for seven days (168 hours) (moisture absorption treatment).

Crushed silica 3 stands for melt-crushed silica particles "Megasil 525", manufactured by Sibelco Japan, has an average particle diameter of 1.6 μm and a specific surface area of 2.2 $m^2/g$, and is not surface-treated.

Crushed silica 4 stands for crushed silica particles obtained by subjecting crushed silica 3 to the moisture absorption treatment mentioned above.

Spherical silica 1 (c) stands for spherical silica particles "SC2500-SEJ", manufactured by Admatechs, has an average particle diameter of 0.8 μm, a specific gravity of 2.2 g/cm$^3$ and a specific surface area of 7 m$^2$/g, and is surface-treated with epoxysilane.

Spherical silica 2 (c) stands for spherical silica particles obtained by subjecting spherical silica 1 to the moisture-absorption treatment mentioned above.

Spherical silica 3 stands for spherical silica particles "SO-25R", manufactured by Admatechs, has an average particle diameter of 0.6 μm and a specific surface area of 6 m$^2$/g, and is not surface-treated.

Spherical silica 4 stands for spherical silica particles obtained by subjecting spherical silica 3 to a moisture-absorption treatment.

As molybdenum compound particles (d), calcium molybdate zinc complex "KEMGARD 911A", manufactured by Sherwin-Williams Company is used. The amount of molybdate, specific gravity, average particle diameter of the calcium molybdate zinc complex is 10% by mass, 3.0 g/cm$^3$, and 2.7 μm, respectively. Alternatively, zinc molybdate-treated talc "KEMGARD 911C", manufactured by Sherwin-Williams Company, is used which is used in the first exemplary embodiment.

A solution of preliminary reaction product PPE (a) is heated to a temperature from 30 to 35° C. in order to achieve the blending ratio shown in Table 8 or Table 9. To the solution, cyanate ester compound (b) and a catalyst are added. In any of samples AG, BJ, and BK, a DCPD-type epoxy resin is also added at that time. Thereafter, complete dissolution is achieved by stirring for 30 minutes. Further, silica particles and molybdenum compound particles are added to the mixture and dispersed with a bead mill to prepare a resin composition in the form of a varnish.

In any of samples BL to BO, the same materials as those of sample AA are used except that the following materials are used as a catalyst and resin components for preparing a resin composition.

<Resin Components>
PPE: "SA90", manufactured by SABIC Innovative Plastics (number average molecular weight: 1500, hydroxyl groups: 1.9)

(Catalyst)
Imidazole: "2E4MZ" (2-ethyl-4-imidazole), manufactured by Shikoku Chemicals Corporation
Metal soap: zinc octanoate (Zn-OCTOATE), manufactured by DIC Corporation Each of the components is added to toluene so as to have the blending ratio shown in Table 8, followed by stirring at a temperature from 30° C. to 35° C. for 60 minutes. Further, silica particles and molybdenum compound particles are added to the mixture and dispersed with a bead mill to prepare a resin composition in the form of a varnish.

In any of samples AI, AJ, BR, and BS, the same materials as those of sample AG are used to prepare a resin composition in the form of a varnish. A solution of preliminary reaction product PPE (a) is heated to a temperature from 30° C. to 35° C. in order to achieve the blending ratio shown in Tables 6 and 10. To the solution, cyanate ester compound (b), a DCPD-type epoxy resin, PPE, and metal soap are added. Thereafter, complete dissolution is achieved by stirring for 30 minutes. Further, silica particles and molybdenum compound particles are added to the mixture and dispersed with a bead mill to prepare a resin composition in the form of a varnish. New silica particles are not used in sample BR, unlike samples BA, BD, and BP.

TABLE 6

| Content of base resin 1 | Product name | Part(s) by mass |
| --- | --- | --- |
| Preliminary reaction product PPE (a) | Refer to Table 5. | 25 |
| Cyanate ester compound (b) | BADCy | 30 |
| DCPD-type epoxy resin | HP7200 | 35 |
| PPE (without preliminary reaction) | SA90 | 10 |
| Metal soap | Zinc octanoate | 0.01 |

In sample BT, each of the components shown in Table 7 is added to toluene so as to have the blending ratio shown in Tables 7 and 10, followed by stirring at a temperature from 30° C. to 35° C. for 60 minutes. Further, silica particles and molybdenum compound particles are added to the resin components and dispersed with a bead mill to prepare a resin composition in the form of a varnish.

TABLE 7

| Content of base resin 2 | Product name | Part(s) by mass |
| --- | --- | --- |
| Cyanate ester compound (b) | BADCy | 30 |
| DCPD-type epoxy resin | HP7200 | 50 |
| PPE (without preliminary reaction) | SA90 | 20 |
| Metal soap | Zinc octanoate | 0.01 |

(2) Prepreg

A prepreg is produced using the same base material as the first exemplary embodiment in the same manner as in the first exemplary embodiment. The resin content (resin amount) of the prepreg is 57% by mass.

(3) Laminate

A laminate for evaluation is produced using the above prepreg in the same manner as in the first exemplary embodiment.

[2] Evaluation and Result of Laminate (1) Glass Transition Temperature

The glass transition temperature of the laminate for evaluation is measured by DSC measurement method based on IPC-TM-650-2.4.25 at a temperature-rising speed of 20° C./minute.

(2) Dielectric Loss Tangent

The dielectric loss tangent at 1 GHz of the laminate for evaluation is measured by the method in accordance with IPC-TM-650-2.5.5.9. Specifically, an impedance analyzer (RF Impedance Analyzer HP4291B, manufactured by Agilent Technologies) is used to measure the dielectric loss tangent at 1 GHz of the laminate for evaluation.

(3) Drill Wear Rate

The drill wear rate is evaluated in the same manner as in the first exemplary embodiment. A detailed description will be omitted.

(4) Gel Time of Varnish

The varnish gel time is a time until 2.5 ml of the obtained resin composition in the form of a varnish gelates on a cure plate at 200° C.

(5) Amount of Water Absorbed in Silica Particles and Amount of Water to be Contained in (Entering) Resin Composition The amount of water absorbed in the silica particles and the amount of water to be contained in the resin composition are calculated using Karl Fischer's method in the same manner as described above.

(6) Coefficient of Linear Thermal Expansion (CTE)

The CTE is evaluated in the same manner as in the first exemplary embodiment. A detailed description will be omitted. The measurement results of the CTE are shown just for reference.

TABLE 8

| | Content | Product name | Unit | Sample BA | BB | BC | BD | BE |
|---|---|---|---|---|---|---|---|---|
| Resin component | Preliminary reaction product PPE (a) | Refer to Table 5. | Parts by mass | 70 | 70 | 70 | 70 | 70 |
| | PPE | SA90 | Parts by mass | | | | | |
| | Cyanate ester compound (b) | BADCy | Parts by mass | 30 | 30 | 30 | 30 | 30 |
| | DCPD-type epoxy resin | HP7200 | Parts by mass | | | | | |
| | Phenol novolak-type epoxy resin | N-770 | Parts by mass | | | | | |
| | Phenol novolak | TD-2090 | Parts by mass | | | | | |
| Catalyst | Imidazole | 2E4MZ | Part by mass | | | | | |
| | Metal soap | Zinc octanoate | Part by mass | 0.005 | 0.005 | 0.005 | 0.005 | 0.005 |
| Inorganic filler | Crushed silica 1 (c) (with surface treatment) | MEGASHIL525RCS | Parts by mass | | | | | |
| | Crushed silica 2 (c) (with surface treatment) *(after moisture-absorption treatment) | MEGASHIL525RCS | Parts by mass | | | | | |
| | Crushed silica 3 (without surface treatment) | MEGASHIL525 | Parts by mass | 50 | | | | |
| | Crushed silica 4 (without surface treatment) *(after moisture-absorption treatment) | MEGASHIL525 | Parts by mass | | 50 | 30 | | |
| | Spherical silica 1 (c) (with surface treatment) | SC2500-SEJ | Parts by mass | | | | | |
| | Spherical silica 2 (c) (with surface treatment) *(after moisture-absorption treatment) | SC2500-SEJ | Parts by mass | | | | | |
| | Spherical silica 3 (Wthout surface treatment) | SO-25R | Parts by mass | | | | 70 | |
| | Spherical silica 4 (without surface treatment) *(after moisture-absorption treatment) | SO-25R | Parts by mass | | | | | 70 |
| | Calcium molybdate zinc complex (d) | 911A | Parts by mass | | | | | |
| | Zinc molybdate (d) (talc support) | 911C | Parts by mass | 3.1 | 3.1 | 3.1 | 2.0 | 2.0 |
| Amount of water | Amount of water absorbed into silica particles | | % | 0.10 | 0.35 | 0.35 | 0.13 | 0.46 |
| | Amount of water contained in resin composition | | % | 0.03 | 0.11 | 0.08 | 0.05 | 0.19 |
| Evaluation results | Tg | | ° C. | 192 | 179 | 183 | 190 | 169 |
| | Dielectric loss tangent (1 GHz) | | — | 0.005 | 0.006 | 0.006 | 0.005 | 0.006 |
| | Drill wear rate | | % | 61 | 61 | 58 | 62 | 62 |
| | Varnish gel time | | Seconds | 175 | 80 | 97 | 169 | 76 |
| | CTE | | ppm/° C. | 42 | 42 | 48 | 36 | 36 |

| | Content | Product name | Unit | Sample BF | BG | BH | BI | BJ |
|---|---|---|---|---|---|---|---|---|
| Resin component | Preliminary reaction product PPE (a) | Refer to Table 5. | Parts by mass | 70 | 70 | 70 | 70 | 35 |
| | PPE | SA90 | Parts by mass | | | | | |
| | Cyanate ester compound (b) | BADCy | Parts by mass | 30 | 30 | 30 | 30 | 30 |
| | DCPD-type epoxy resin | HP7200 | Parts by mass | | | | | 35 |
| | Phenol novolak-type epoxy resin | N-770 | Parts by mass | | | | | |
| | Phenol novolak | TD-2090 | Parts by mass | | | | | |
| Catalyst | Imidazole | 2E4MZ | Part by mass | | | | | |
| | Metal soap | Zinc octanoate | Part by mass | 0.005 | 0.005 | 0.005 | 0.005 | 0.005 |
| Inorganic filler | Crushed silica 1 (c) (with surface treatment) | MEGASHIL525RCS | Parts by mass | | | 50 | | |
| | Crushed silica 2 (c) (with surface treatment) *(after moisture-absorption treatment) | MEGASHIL525RCS | Parts by mass | | | | 50 | 50 |
| | Crushed silica 3 (without surface treatment) | MEGASHIL525 | Parts by mass | | | | | |
| | Crushed silica 4 (without surface treatment) *(after moisture-absorption treatment) | MEGASHIL525 | Parts by mass | | | | | |
| | Spherical silica 1 (c) (with surface treatment) | SC2500-SEJ | Parts by mass | 70 | | | | |
| | Spherical silica 2(c) (with surface treatment) *(after moisture-absorption treatment) | SC2500-SEJ | Parts by mass | | 70 | | | |
| | Spherical silica 3 (Wthout surface treatment) | SO-25R | Parts by mass | | | | | |
| | Spherical silica 4 (without surface treatment) *(after moisture-absorption treatment) | SO-25R | Parts by mass | | | | | |
| | Calcium molybdate zinc complex (d) | 911A | Parts by mass | | | | | |
| | Zinc molybdate (d) (talc support) | 911C | Parts by mass | | | | | |
| Amount of water | Amount of water absorbed into silica particles | | % | 0.06 | 0.07 | 0.07 | 0.08 | 0.08 |
| | Amount of water contained in resin composition | | % | 0.02 | 0.03 | 0.02 | 0.03 | 0.03 |
| Evaluation results | Tg | | ° C. | 199 | 199 | 199 | 199 | 196 |
| | Dielectric loss tangent (1 GHz) | | — | 0.005 | 0.005 | 0.005 | 0.005 | 0.005 |
| | Drill wear rate | | % | 71 | 71 | 75 | 75 | 75 |
| | Varnish gel time | | Seconds | 175 | 175 | 185 | 185 | 185 |
| | CTE | | ppm/° C. | 36 | 36 | 42 | 42 | 42 |

| | Content | Product name | Unit | Sample BK | BL | BM | BN | BO |
|---|---|---|---|---|---|---|---|---|
| Resin component | Preliminary reaction product PPE (a) | Refer to Table 5. | Parts by mass | 35 | | | | |
| | PPE | SA90 | Parts by mass | | 28 | 28 | | |
| | Cyanate ester compound (b) | BADCy | Parts by mass | 30 | 30 | 30 | | |
| | DCPD-type epoxy resin | HP7200 | Parts by mass | 35 | 42 | 42 | | |
| | Phenol novolak-type epoxy resin | N-770 | Parts by mass | | | | 65 | 65 |
| | Phenol novolak | TD-2090 | Parts by mass | | | | 35 | 35 |
| Catalyst | Imidazole | 2E4MZ | Part by mass | | | | 0.1 | 0.1 |
| | Metal soap | Zinc octanoate | Part by mass | 0.005 | 0.005 | 0.005 | | |

TABLE 8-continued

| | Content | | Product name | Unit | | | | | |
|---|---|---|---|---|---|---|---|---|---|
| Inorganic filler | Crushed silica 1 (c) (with surface treatment) | | MEGASHIL525RCS | Parts by mass | | 50 | | | |
| | Crushed silica 2 (c) (with surface treatment) *(after moisture-absorption treatment) | | MEGASHIL525RCS | Parts by mass | | | 50 | | |
| | Crushed silica 3 (without surface treatment) | | MEGASHIL525 | Parts by mass | | | | 50 | |
| | Crushed silica 4 (without surface treatment) *(after moisture-absorption treatment) | | MEGASHIL525 | Parts by mass | 50 | | | | 50 |
| | Spherical silica 1 (c) (with surface treatment) | | SC2500-SEJ | Parts by mass | | | | | |
| | Spherical silica 2(c) (with surface treatment) *(after moisture-absorption treatment) | | SC2500-SEJ | Parts by mass | | | | | |
| | Spherical silica 3 (Wthout surface treatment) | | SO-25R | Parts by mass | | | | | |
| | Spherical silica 4 (without surface treatment) *(after moisture-absorption treatment) | | SO-25R | Parts by mass | | | | | |
| | Calcium molybdate zinc complex (d) | 911A | | Parts by mass | | | | | |
| | Zinc molybdate (d) (talc support) | 911C | | Parts by mass | 3.1 | 3.1 | 3.1 | 3.1 | 3.1 |
| Amount of water | Amount of water absorbed into silica particles | | | % | 0.35 | 0.07 | 0.08 | 0.10 | 0.35 |
| | Amount of water contained in resin composition | | | % | 0.11 | 0.02 | 0.03 | 0.03 | 0.11 |
| Evaluation results | Tg | | | ° C. | 184 | 155 | 155 | 155 | 149 |
| | Dielectric loss tangent (1 GHz) | | | — | 0.006 | 0.005 | 0.005 | 0.017 | 0.018 |
| | Drill wear rate | | | % | 61 | 61 | 61 | 60 | 60 |
| | Varnish gel time | | | Seconds | 95 | 190 | 190 | 230 | 235 |
| | CTE | | | ppm/° C. | 42 | 42 | 42 | 45 | 45 |

| | | Content | Product name | Unit | Sample BP | Sample BQ |
|---|---|---|---|---|---|---|
| Resin component | | Preliminary reaction product PPE (a) | Refer to Table 5. | Parts by mass | 70 | 70 |
| | | PPE | SA90 | Parts by mass | | |
| | | Cyanate ester compound (b) | BADCy | Parts by mass | 30 | 30 |
| | | DCPD-type epoxy resin | HP7200 | Parts by mass | | |
| | | Phenol novolak-type epoxy resin | N-770 | Parts by mass | | |
| | | Phenol novolak | TD-2090 | Parts by mass | | |
| Catalyst | | Imidazole | 2E4MZ | Part by mass | | |
| | | Metal soap | Zinc octanoate | Part by mass | 0.005 | 0.005 |
| Inorganic filler | | Crushed silica 1 (c) (with surface treatment) | MEGASHIL525RCS | Parts by mass | | |
| | | Crushed silica 2 (c) (with surface treatment) *(after moisture-absorption treatment) | MEGASHIL525RCS | Parts by mass | | |
| | | Crushed silica 3 (without surface treatment) | MEGASHIL525 | Parts by mass | 50 | |
| | | Crushed silica 4 (without surface treatment) *(after moisture-absorption treatment) | MEGASHIL525 | Parts by mass | | 50 |
| | | Spherical silica 1 (c) (with surface treatment) | SC2500-SEJ | Parts by mass | | |
| | | Spherical silica 2(c) (with surface treatment) *(after moisture-absorption treatment) | SC2500-SEJ | Parts by mass | | |
| | | Spherical silica 3 (Wthout surface treatment) | SO-25R | Parts by mass | | |
| | | Spherical silica 4 (without surface treatment) *(after moisture-absorption treatment) | SO-25R | Parts by mass | | |
| | | Calcium molybdate zinc complex (d) | 911A | Parts by mass | 3.1 | 3.1 |
| | | Zinc molybdate (d) (talc support) | 911C | Parts by mass | | |
| Amount of water | | Amount of water absorbed into silica particles | | % | 0.10 | 0.35 |
| | | Amount of water contained in resin composition | | % | 0.03 | 0.11 |
| Evaluation results | | Tg | | ° C. | 192 | 179 |
| | | Dielectric loss tangent (1 GHz) | | — | 0.005 | 0.006 |
| | | Drill wear rate | | % | 63 | 63 |
| | | Varnish gel time | | Seconds | 166 | 86 |
| | | CTE | | ppm/° C. | 42 | 42 |

TABLE 9

| | | | | Sample | | | | |
|---|---|---|---|---|---|---|---|---|
| | Content | Product name | Unit | AA | AB | AC | AD | AE |
| Resin component | Preliminary reaction product PPE (a) | Refer to Table 5. | Parts by mass | 70 | 70 | 70 | 70 | 70 |
| | PPE | SA90 | Parts by mass | | | | | |
| | Cyanate ester compound (b) | BADCy | Parts by mass | 30 | 30 | 30 | 30 | 30 |
| | DCPD-type epoxy resin | HP7200 | Parts by mass | | | | | |
| | Phenol novolak-type epoxy resin | N-770 | Parts by mass | | | | | |
| | Phenol novolak | TD-2090 | Parts by mass | | | | | |
| Catalyst | Imidazole | 2E4MZ | Parts by mass | | | | | |
| | Metal soap | Zinc octanoate | Part by mass | 0.005 | 0.005 | 0.005 | 0.005 | 0.005 |
| Inorganic filler | Crushed silica 1 (c) (with surface treatment) | MEGASHIL525RCS | Parts by mass | 50 | | | | |
| | Crushed silica 2 (c) (with surface treatment) * (after moisture-absorption treatment) | MEGASHIL525RCS | Parts by mass | | 50 | 50 | 30 | |
| | Crushed silica 3 (without surface treatment) | MEGASHIL525 | Parts by mass | | | | | |
| | Crushed silica 4 (without surface treatment) * (after moisture-absorption treatment) | MEGASHIL525 | Parts by mass | | | | | |
| | Spherical silica 1 (c) (with surface treatment) | SC2500-SEJ | Parts by mass | | | | | 70 |

TABLE 9-continued

|  | Content | Product name | Unit | | | | | |
|---|---|---|---|---|---|---|---|---|
|  | Spherical silica 2 (c) (with surface treatment) * (after moisture-absorption treatment) | SC2500-SEJ | Parts by mass | | | | | |
|  | Spherical silica 3 (without surface treatment) | SO-25R | Parts by mass | | | | | |
|  | Spherical silica 4 (without surface treatment) * (after moisture-absorption treatment) | SO-25R | Parts by mass | | | | | |
|  | Calcium molybdate zinc complex (d) | 911A | Parts by mass | | | | | |
|  | Zinc molybdate (d) (talc support) | 911C | Parts by mass | 3.1 | 3.1 | 5.0 | 3.1 | 2.0 |
| Amount of water | Amount of water absorbed into silica particles | | % | 0.07 | 0.08 | 0.08 | 0.08 | 0.06 |
|  | Amount of water contained in resin composition | | % | 0.02 | 0.03 | 0.03 | 0.02 | 0.02 |
| Evaluation results | Tg | | °C. | 192 | 192 | 188 | 190 | 193 |
|  | Dielectric loss tangent (1 GHz) | | — | 0.005 | 0.005 | 0.005 | 0.005 | 0.005 |
|  | Drill wear rate | | % | 61 | 61 | 61 | 58 | 62 |
|  | Varnish gel time | | Seconds | 175 | 175 | 170 | 171 | 169 |
|  | CTE | | ppm/°C. | 42 | 42 | 42 | 48 | 36 |

|  |  |  |  |  | Sample | | |
|---|---|---|---|---|---|---|---|
|  | Content | Product name | Unit | AF | AG | AH | |
| Resin component | Preliminary reaction product PPE (a) | Refer to Table 5. | Parts by mass | 70 | 35 | 70 | |
|  | PPE | SA90 | Parts by mass | | | | |
|  | Cyanate ester compound (b) | BADCy | Parts by mass | 30 | 30 | 30 | |
|  | DCPD-type epoxy resin | HP7200 | Parts by mass | | 35 | | |
|  | Phenol novolak-type epoxy resin | N-770 | Parts by mass | | | | |
|  | Phenol novolak | TD-2090 | Parts by mass | | | | |
| Catalyst | Imidazole | 2E4MZ | Parts by mass | | | | |
|  | Metal soap | Zinc octanoate | Part by mass | 0.005 | 0.005 | 0.005 | |
| Inorganic filler | Crushed silica 1 (c) (with surface treatment) | MEGASHIL525RCS | Parts by mass | | | | |
|  | Crushed silica 2 (c) (with surface treatment) * (after moisture-absorption treatment) | MEGASHIL525RCS | Parts by mass | | 50 | 50 | |
|  | Crushed silica 3 (without surface treatment) | MEGASHIL525 | Parts by mass | | | | |
|  | Crushed silica 4 (without surface treatment) * (after moisture-absorption treatment) | MEGASHIL525 | Parts by mass | | | | |
|  | Spherical silica 1 (c) (with surface treatment) | SC2500-SEJ | Parts by mass | | | | |
|  | Spherical silica 2 (c) (with surface treatment) * (after moisture-absorption treatment) | SC2500-SEJ | Parts by mass | 70 | | | |
|  | Spherical silica 3 (without surface treatment) | SO-25R | Parts by mass | | | | |
|  | Spherical silica 4 (without surface treatment) * (after moisture-absorption treatment) | SO-25R | Parts by mass | | | | |
|  | Calcium molybdate zinc complex (d) | 911A | Parts by mass | | | 3.1 | |
|  | Zinc molybdate (d) (talc support) | 911C | Parts by mass | 2.0 | 3.1 | | |
| Amount of water | Amount of water absorbed into silica particles | | % | 0.07 | 0.08 | 0.08 | |
|  | Amount of water contained in resin composition | | % | 0.03 | 0.03 | 0.03 | |
| Evaluation results | Tg | | °C. | 193 | 190 | 192 | |
|  | Dielectric loss tangent (1 GHz) | | — | 0.005 | 0.005 | 0.005 | |
|  | Drill wear rate | | % | 62 | 61 | 63 | |
|  | Varnish gel time | | Seconds | 169 | 179 | 166 | |
|  | CTE | | ppm/°C. | 36 | 42 | 42 | |

TABLE 10

|  |  |  |  | Sample | | | | |
|---|---|---|---|---|---|---|---|---|
|  | Content | Product name | Unit | BR | BS | BT | AI | AU |
| Resin component | Base resin 1 | Refer to Table 6 | Parts by mass | 100 | 100 | | 100 | 100 |
|  | Base resin 2 | Refer to Table 7 | Parts by mass | | | 100 | | |
| Inorganic filler | Crushed silica 1 (c) (with surface treatment) | MEGASIL525RCS | Parts by mass | | | | 65 | |
|  | Crushed silica 2 (c) (with surface treatment) * (after moisture-absorption treatment) | MEGASIL525RCS | Parts by mass | | | | | 65 |
|  | Crushed silica 3 (without surface treatment) | MEGASIL525 | Parts by mass | 65 | | 65 | | |
|  | Crushed silica 4 (without surface treatment) * (after moisture-absorption treatment) | MEGASIL525 | Parts by mass | | 65 | | | |
|  | Zinc molybdate (d) | 911C | Parts by mass | 1.2 | 1.2 | 1.2 | 1.2 | 1.2 |
| Amount of water | Amount of water absorbed into silica particles | | % | 0.13 | 0.25 | 0.13 | 0.07 | 0.08 |
| Evaluation results | Tg (°C.) | | °C. | 200 | 185 | 173 | 200 | 200 |
|  | Dielectric loss tangent (1 GHz) | | — | 3.8 | 4.0 | 3.8 | 3.8 | 3.8 |
|  | Varnish gel time (200° C.) | | Seconds | 167 | 120 | 192 | 180 | 180 |
|  | CTE | | ppm/°C. | 37 | 37 | 40 | 37 | 37 |

In any of samples AA to AJ, surface-treated hydrophobic silica particles are used as the silica particles. Accordingly, the glass transition temperature is high and the dielectric loss tangent is low. In comparison of sample AA without moisture-absorption treatment and sample AB after moisture-absorption treatment, as well as sample AE without moisture-absorption treatment and sample AF after moisture-absorption treatment, these samples have the same glass transition temperature and the same dielectric loss tangent. That is, the glass transition temperature and the dielectric characteristics are stably excellent before and after the moisture-absorption treatment. Further, since the resin composition contains hydrophobic silica particles and molybdenum compound particles, drill wear rate is low. That is, drilling workability and moldability are good.

In contrast, any of samples BA to BQ is not a resin composition obtained by blending preliminary reaction product (a) of polyphenylene ether and epoxy compound, cyanate ester compound (b), hydrophobic silica particles (c), and molybdenum compound particles (d). Accordingly, samples except for samples BA, BD, and BP obtained by using new silica particles (silica particles in a dry state) do not provide good drilling workability and moldability while being excellent in glass transition temperature and dielectric characteristics.

In comparison of sample BA without moisture-absorption treatment and sample BB after moisture-absorption treatment, sample BD without moisture-absorption treatment and sample BE after moisture-absorption treatment, as well as sample BP without moisture-absorption treatment and sample BQ after moisture-absorption treatment, when the silica particles after moisture-absorption treatment is used, the glass transition temperature is lowered, the dielectric loss tangent is increased, the varnish gel time is significantly shortened, compared to the case of using the silica particles without moisture-absorption treatment. That is, excellent glass transition temperature and dielectric characteristics are impaired after the moisture-absorption treatment. This tendency is the same even if the content of the silica particles in the resin composition is small (sample BC).

In any of samples BF to BJ, molybdenum compound particles are not blended. Thus, drill wear rate is high. That is, drilling workability and moldability are not good. In comparison of sample BF without moisture-absorption treatment and sample BG after moisture-absorption treatment, as well as sample BH after moisture-absorption treatment and sample BI after moisture-absorption treatment, the varnish gel time of these samples is the same as the varnish gel time of samples AA to AJ. Based on these results and the results of samples BD and BE, it is assumed that the varnish gel time shortening is accelerated by molybdenum compound particles.

In any of samples BL and BM, the glass transition temperature is low because preliminary reaction PPE (a) is not used. In comparison of samples BL and BM, both the samples have the same varnish gel time regardless of presence or absence of the moisture-absorption treatment. The varnish gel time of each of them is longer than those of samples AA to AJ.

In the cases of samples BN and BO, the resin component does not contain polyphenylene ether, and thus the glass transition temperature is low and the dielectric loss tangent is high. In comparison of samples BN and BO, both the samples have the same varnish gel time regardless of presence or absence of the moisture-absorption treatment. The varnish gel time of each of them is longer than those of samples AA to AJ. In contrast to these results and the results of samples BL and BM, an unusually short varnish gel time is observed in samples BB, BC, BE, BK, and BQ obtained by using moisture absorbed silica particles, the resin composition containing preliminary reaction product (a) of polyphenylene ether and epoxy compound, cyanate ester compound (b), and molybdenum compound particles (d).

In any of samples AI and AJ, surface-treated hydrophobic silica particles are used as the silica particles. Thus, the glass transition temperature is high and the dielectric loss tangent is low. In comparison of samples AI and AJ, both the samples have the same glass transition temperature and the same dielectric loss tangent regardless of presence or absence of the moisture-absorption treatment. That is, the glass transition temperature and the dielectric characteristics are stably excellent.

In contrast, any of samples BR to BT is not a resin composition obtained by blending preliminary reaction product (a) of polyphenylene ether and epoxy compound, cyanate ester compound (b), hydrophobic silica particles (c), and molybdenum compound particles (d). Accordingly, excellent glass transition temperature and dielectric characteristics cannot be achieved.

In sample BR, new silica particles are not used unlike the cases of samples BA, BD, and BP. Hence, silica particles having a high absorption content of water are used, so that the varnish gel time is short.

As for sample BS obtained by using the silica particles after moisture-absorption treatment, the glass transition temperature is decreased, the dielectric loss tangent is increased, and the varnish gel time is significantly shortened, compared to sample BR obtained by using the silica particles without moisture-absorption treatment. Hence, it is found that the glass transition temperature and the dielectric characteristics are impaired after the moisture-absorption treatment.

In sample BT, the glass transition temperature is low because preliminary reaction product (a) is not used.

INDUSTRIAL APPLICABILITY

The hardened substance of the resin composition for circuit board according to the present invention has a small coefficient of linear thermal expansion and excellent drilling workability, and is excellent in glass transition temperature and dielectric characteristics when applied to a printed circuit board. It is possible to provide the printed circuit board at relatively low prices. Therefore, the resin composition for circuit board according to the present invention is useful.

The invention claimed is:
1. A resin composition for printed circuit board, comprising:
    a resin component containing a thermosetting resin; and
    an inorganic filler containing:
        crushed silica having a specific surface area in a range from 0.1 $m^2/g$ to 15 $m^2/g$, inclusive; and
        molybdenum compound particles each having a molybdenum compound in at least a surface layer portion thereof,
    wherein a content of the crushed silica is in a range from 10 parts by mass to 150 parts by mass, inclusive, with respect to 100 parts by mass of the resin component.
2. The resin composition for printed circuit board according to claim 1,
    wherein the molybdenum compound is at least one selected from the group consisting of zinc molybdate, calcium molybdate, and magnesium molybdate.
3. The resin composition for printed circuit board according to claim 1,
    wherein a content of the molybdenum compound particles is in a range from 0.1 by volume to 10% by volume, inclusive, with respect to 100% by volume of a total amount of the inorganic filler.
4. The resin composition for printed circuit board according to claim 1, wherein a content of the molybdenum compound is in a range from 0.05 part by mass to 5 parts by mass, inclusive, with respect to 100 parts by mass of the resin component.

5. The resin composition for printed circuit board according to claim 1,
wherein the inorganic filler further contains spherical silica.

6. The resin composition for printed circuit board according to claim 1,
wherein a content of the inorganic filler is in a range from 15 parts by mass to 400 parts by mass, inclusive, with respect to 100 parts by mass of the resin component.

7. The resin composition for printed circuit board according to claim 1,
wherein the resin component contains:
a preliminary reaction product obtained by reacting polyphenylene ether with an epoxy compound having an epoxy group; and
a cyanate ester compound, and
the crushed silica has a hydrophobic-treated surface.

8. The resin composition for printed circuit board according to claim 7,
wherein the molybdenum compound is at least one selected from the group consisting of zinc molybdate, calcium molybdate, and magnesium molybdate.

9. The resin composition for printed circuit board according to claim 7,
wherein a content of the molybdenum compound particles is in a range from 0.1 part by mass to 10 parts by mass, inclusive, with respect to 100 parts by mass of the resin component.

10. The resin composition for printed circuit board according to claim 7,
wherein a content of the hydrophobic silica particles is in a range from 10 parts by mass to 200 parts by mass, inclusive, with respect to 100 parts by mass of the resin component.

11. A prepreg comprising:
a base material; and
the resin composition for printed circuit board according to claim 1 with which the base material is impregnated and which is semi-hardened.

12. A metal-clad laminate comprising:
an insulating layer which is a hardened substance of the prepreg according to claim 11; and
a metal foil laminated on the insulating layer.

13. A printed circuit board comprising:
an insulating layer which is a hardened substance of the prepreg according to claim 11; and
a conductor pattern formed on the insulating layer.

* * * * *